United States Patent
Reboh et al.

(10) Patent No.: US 10,818,775 B2
(45) Date of Patent: Oct. 27, 2020

(54) METHOD FOR FABRICATING A FIELD-EFFECT TRANSISTOR

(71) Applicants: Commissariat a l'energie atomique et aux energies alternatives, Paris (FR); International Business Machines Corporation, Yorktown Heights, NY (US)

(72) Inventors: Shay Reboh, Grenoble (FR); Emmanuel Augendre, Montbonnot (FR); Remi Coquand, Les Marches (FR); Nicolas Loubet, Guilderland, NY (US)

(73) Assignees: Commissariat a l'energie atomique et aux energies alternatives, Paris (FR); International Business Machines Corporation, Yorktown Heights, NY (US)

( * ) Notice: Subject to any disclaimer, the term of this patent is extended or adjusted under 35 U.S.C. 154(b) by 167 days.

(21) Appl. No.: 16/190,747

(22) Filed: Nov. 14, 2018

(65) Prior Publication Data
US 2019/0157422 A1    May 23, 2019

(30) Foreign Application Priority Data
Nov. 14, 2017   (FR) ..................... 17 60713

(51) Int. Cl.
   *H01L 29/66*     (2006.01)
   *H01L 29/06*     (2006.01)
   (Continued)

(52) U.S. Cl.
   CPC .. *H01L 29/66545* (2013.01); *H01L 21/02603* (2013.01); *H01L 29/0653* (2013.01);
   (Continued)

(58) Field of Classification Search
USPC .......................................... 257/288
(Continued)

(56) References Cited

U.S. PATENT DOCUMENTS 8,778,768 B1   7/2014   Chang et al.
8,796,742 B1   8/2014   Chang et al.
(Continued)

FOREIGN PATENT DOCUMENTS

WO   WO 2014/004033 A1   1/2014
WO   WO 2017/052644 A1   3/2017

OTHER PUBLICATIONS

French Preliminary Search Report dated Jul. 24, 2018 in French Application 17 60713 filed on Nov. 14, 2017 (with English Translation of Categories of Documents and Written Opinion).
(Continued)

*Primary Examiner* — Hrayr A Sayadian
(74) *Attorney, Agent, or Firm* — Oblon, McClelland, Maier & Neustadt, L.L.P.

(57) ABSTRACT

The method for fabricating a field-effect transistor comprises a step of producing a sacrificial gate and first and second spacers covering first, second and third parts of successive first to fifth semiconductor nanowires of a stack. The fabricating method comprises a step of forming a channel area of the transistor, which channel area is compressively stressed and distinct from the second part of the third nanowire. The channel area is connected to a source electrode of the transistor by the first part of the second nanowire, and to a drain electrode of the transistor by the third part of the second nanowire.

13 Claims, 8 Drawing Sheets

(51) Int. Cl.
*H01L 29/775* (2006.01)
*H01L 21/02* (2006.01)
*H01L 29/10* (2006.01)
*H01L 29/161* (2006.01)
*H01L 29/417* (2006.01)
*H01L 29/78* (2006.01)

(52) U.S. Cl.
CPC ...... *H01L 29/0673* (2013.01); *H01L 29/1033* (2013.01); *H01L 29/161* (2013.01); *H01L 29/41791* (2013.01); *H01L 29/6656* (2013.01); *H01L 29/66439* (2013.01); *H01L 29/66795* (2013.01); *H01L 29/775* (2013.01); *H01L 29/785* (2013.01)

(58) Field of Classification Search
IPC .................. H01L 29/161,29/66439, 29/66545, 29/6656, 21/02603, 29/1033, 29/66798, 29/41791, 29/0673, 29/785, 29/0653, 29/775
See application file for complete search history.

(56) References Cited

U.S. PATENT DOCUMENTS

| | | |
|---|---|---|
| 2015/0069328 A1* | 3/2015 | Leobandung ..... H01L 29/42392 257/24 |
| 2016/0211322 A1 | 7/2016 | Kim et al. |
| 2016/0276484 A1 | 9/2016 | Kim et al. |
| 2017/0025314 A1 | 1/2017 | Witters et al. |
| 2017/0047452 A1 | 2/2017 | Kim et al. |
| 2017/0263706 A1* | 9/2017 | Gardner ............ H01L 29/66545 |

OTHER PUBLICATIONS

Loubtet, N. et al. "Stacked Nanosheet Gate-All-Around Transistor to Enable Scaling Beyond FinFET," 2017 Symposium on VLSI Technology Digest of Technical Papers, 978-4-86348-605-8, 2017, pp. 2.

Barraud, S. et al. "Vertically Stacked-NanoWires MOSFETs in a Replacement Metal Gate Process with Inner Spacer and SiGe Source/Drain," IEDM16-466, 978-1-5090-3902-9, pp. 4.

* cited by examiner

METHOD FOR FABRICATING A FIELD-EFFECT TRANSISTOR

TECHNICAL FIELD OF THE INVENTION

The technical field of the invention relates to field-effect transistors, notably gate-all-around field-effect transistors, and in particular to a method for fabricating such a transistor.

PRIOR ART

In the field of field-effect transistors, there is a "gate-all-around" configuration also known under the abbreviation GAA. In such a configuration, the gate electrode of the transistor surrounds a channel area of the transistor, notably with interposition of a gate insulator.

A known method for fabricating a pMOS (abbreviation of "P-type Metal Oxide Semiconductor") type gate-all-around field-effect transistor is as follows. A stack of nanowires comprising an alternation of silicon nanowires and of silicon-germanium (SiGe) nanowires is formed on a substrate. On this stack, a sacrificial gate is formed, then external spacers are arranged on either side of the sacrificial gate so as to cover a part of the stack. The sacrificial gate and the external spacers are formed thanks to suitable lithography and etching steps. Parts of the nanowires of the stack which extend beyond the covering formed by the sacrificial gate and by the external spacers are removed, for example by etching. Opposite longitudinal ends of the silicon-germanium nanowires, which ends remain under the covering formed by the sacrificial gate and the external spacers, are then etched horizontally, i.e. notably along the elongation axis of the nanowires, so as to form recesses that are then filled with an electrically insulating material to form internal spacers the role of which is, in collaboration with the external spacers, to separate the future source and drain electrodes from the future gate electrode to improve the performance of the transistor by decreasing the parasitic capacitances of the latter. Next, source and drain electrodes are formed epitaxially in continuity with those parts of the silicon nanowires which were preserved under the sacrificial gate and the external spacers. The source and drain electrodes are then encapsulated in an encapsulating or passivating material. Next, the sacrificial gate is removed to reveal parts of the nanowires between the external spacers. By selective etching, the parts of the SiGe nanowires revealed by removing the sacrificial gate are removed. Next, a gate insulator is formed around the silicon nanowires, then a gate material is deposited on the gate insulator so as to form a gate electrode surrounding the silicon-nanowire parts located between the external spacers.

It is known that a tensile stress is beneficial for the n-type transistors also known as nMOS (abbreviation of "N-type Metal Oxide Semiconductor) transistors but is problematic for the p-type transistors also known as pMOS transistors, for which a compressive stress of the channel is preferably sought. As a result, there is a need to provide a method that allows a transistor, notably a pMOS type transistor, the channel area of which is compressed and in particular the current flow of which is improved, to be fabricated.

SUBJECT OF THE INVENTION

The aim of the invention is to provide a fabricating method allowing a transistor with a compressively stressed channel area to be fabricated from a semiconductor stack, and notably this transistor being such that current flow between the channel area and source and drain electrodes is improved.

This aim is approached thanks to a method for fabricating a field-effect transistor, this fabricating method being characterized in that it comprises:
    a step of forming, on a substrate, a stack comprising successive first to fifth semiconductor nanowires,
    a step of producing a sacrificial gate and first and second spacers arranged on either side of the sacrificial gate, the sacrificial gate and the first and second spacers covering a part of the stack comprising first, second and third parts of each of the first to fifth nanowires,
    a step of removing the sacrificial gate,
    a step of removing the second parts of the first and fifth nanowires, which second parts are made accessible by the step of removing the sacrificial gate,
    a step of forming a channel area of the transistor, which channel area is compressively stressed and distinct from the second part of the third nanowire, said channel area being connected:
        to a source electrode of the transistor by the first part of the second nanowire, and
        to a drain electrode of the transistor by the third part of the second nanowire,
    a step of producing a gate electrode of the transistor between the first and second spacers and around the channel area.

The fabricating method may comprise one or more of the following features:
    the fabricating method is such that:
        the step of forming the stack is such that the second and fourth nanowires are compressively stressed,
        said channel area of the transistor is a first channel area formed by the second part of the second nanowire connecting the first and third parts of the second nanowire,
        a compressively stressed second channel area of the transistor is formed by the second part of the fourth nanowire connecting the first and third parts of the fourth nanowire, the first part of the fourth nanowire connecting the source electrode to the second part of the fourth nanowire, and the third part of the fourth nanowire connecting the drain electrode to the second part of the fourth nanowire,
        the second part of the third nanowire is arranged between the second parts of the second and fourth nanowires, and
        the step of producing the gate electrode is such that said gate electrode surrounds an assembly formed by a superposition of the second parts of the second to fourth nanowires;
    the fabricating method is such that:
        it comprises a step of removing the second parts of the second and fourth nanowires, which results in releasing the second part of the third nanowire between the first and second spacers,
        it comprises a step of growing a material epitaxially, from the second part of the third nanowire, to form the channel area having a compressive stress being induced by the second part of the third nanowire,
        at the end of the step of growing the material epitaxially, the first part of the fourth nanowire connects the channel area to the source electrode, and the third part of the fourth nanowire connects the channel area to the drain electrode;

the epitaxial growth step is such that the channel area has a thickness, in a direction normal to the surface of the second part of the third nanowire, equal to the thickness of the second and fourth nanowires measured in the stacking direction of the first to fifth nanowires;

the second and fourth nanowires of the stack are electrically doped, preferably with boron.

the step of forming the stack is such that the third nanowire is a silicon nanowire and the first, second, fourth and fifth nanowires are silicon-germanium nanowires, the proportion of germanium in the silicon-germanium of the first and fifth nanowires being strictly higher than the proportion of germanium in the silicon-germanium of the second and fourth nanowires;

the proportion of germanium in the silicon-germanium of the first and fifth nanowires is comprised between 25 at % and 50 at %, and the proportion of germanium in the silicon-germanium of the second and fourth nanowires is comprised between 10 at % and 40 at %;

that it comprises, after the step of producing the sacrificial gate and the first and second spacers:

a step of removing portions of the stack in such a way that that part of the stack that is covered by the sacrificial gate and by the first and second spacers is preserved, then a step of producing source and drain electrodes on either side of a structure comprising the sacrificial gate and the first and second spacers so that:

the source electrode makes contact with the first parts of the second, third and fourth nanowires, and the drain electrode makes contact with the third parts of the second, third and fourth nanowires;

the fabricating method comprises, between the step of removing portions of the stack and the step of producing source and drain electrodes:

a step of removing all or some of the first and third parts of the first and fifth nanowires, which parts are located under the first and second spacers, so as to form cavities, a step of filling the cavities with an electrical insulator to form internal spacers that are intended to electrically insulate and separate the gate electrode of the transistor from the source and drain electrodes of the transistor;

the fabricating method is such that:

the third nanowire has a thickness, measured in a stacking direction of the first to fifth nanowires, comprised between 2 nm and 15 nm, the second and fourth nanowires each have a thickness, measured in the stacking direction of the first to fifth nanowires, comprised between 1 nm and 5 nm, the first and fifth nanowires each have a thickness, measured in the stacking direction of the first to fifth nanowires, comprised between 5 nm and 25 nm.

The invention also relates to an electronic device comprising a field-effect transistor having first and second spacers between which is arranged a gate electrode of the transistor, the first and second spacers being located between a source electrode of the transistor and a drain electrode of the transistor, said transistor comprising at least one semiconductor nano-object connecting the source electrode to the drain electrode, a first part of the nano-object being located under the first spacer, and a second part of the nano-object connecting the first part of the nano-object to a third part of the nano-object, which third part is located under the second spacer, this electronic device being characterized in that:

the first part of the nano-object is interposed between, and makes contact with, first and second semiconductor elements of the transistor, said first and second semiconductor elements preferably being compressively stressed, the third part of the nano-object is interposed between, and makes contact with, third and fourth semiconductor elements of the transistor, said third and fourth semiconductor elements preferably being compressively stressed, the first semiconductor element connects the source electrode to a compressively stressed channel area of the transistor, and the third semiconductor element connects the drain electrode to the channel area of the transistor, said channel area being distinct from the nano-object, the gate electrode surrounds the channel area of the transistor.

The electronic device may be such that the transistor comprises first and second semiconductor bars, the nano-object being arranged between the first and second bars, the first bar comprising, in succession, a first part forming the first semiconductor element, a second part forming the channel area, and a third part forming the third semiconductor element, and the second bar comprises, in succession, first, second and third parts, the second part of the second bar forming a compressively stressed additional channel area of the transistor, the first part of the second bar forming the second element connecting the additional channel area to the source electrode, and the third part of the second bar forming the fourth element connecting the additional channel area to the drain electrode.

The electronic device may also be such that the second part of the nano-object is covered with a sleeve forming the compressively stressed channel area of the transistor, the first and second semiconductor elements connecting this sleeve to the source electrode, and the third and fourth semiconductor elements connecting this sleeve to the drain electrode.

BRIEF DESCRIPTION OF THE FIGURES

The invention will be better understood on reading the following description, which is given merely by way of non-limiting example and with reference to the figures in which.

Figure 1:
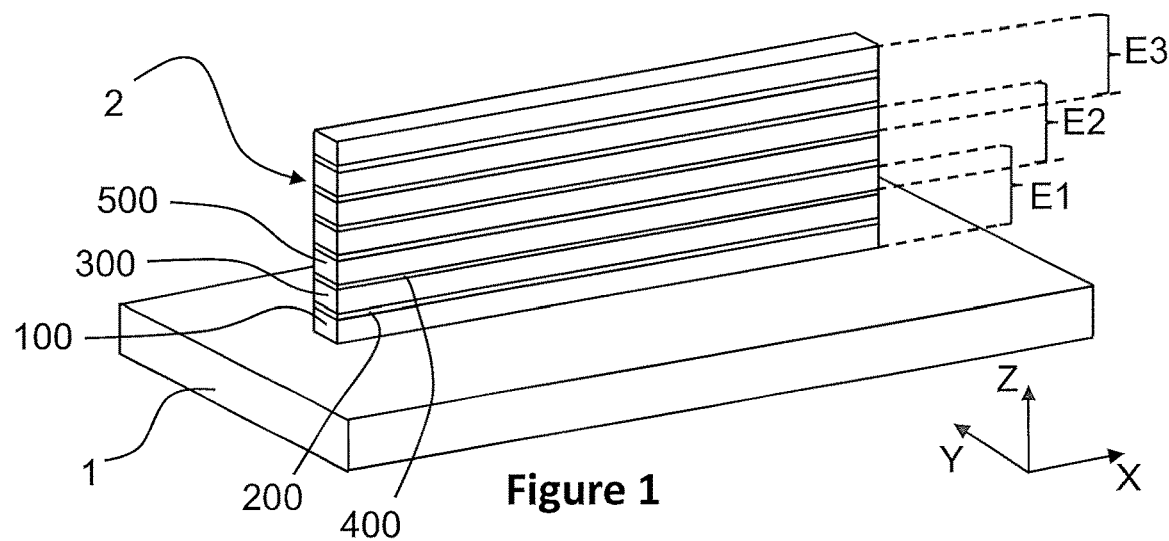
FIGS. 1 to 3 illustrate perspective views of various steps of a method for fabricating a transistor.
Figure 2:
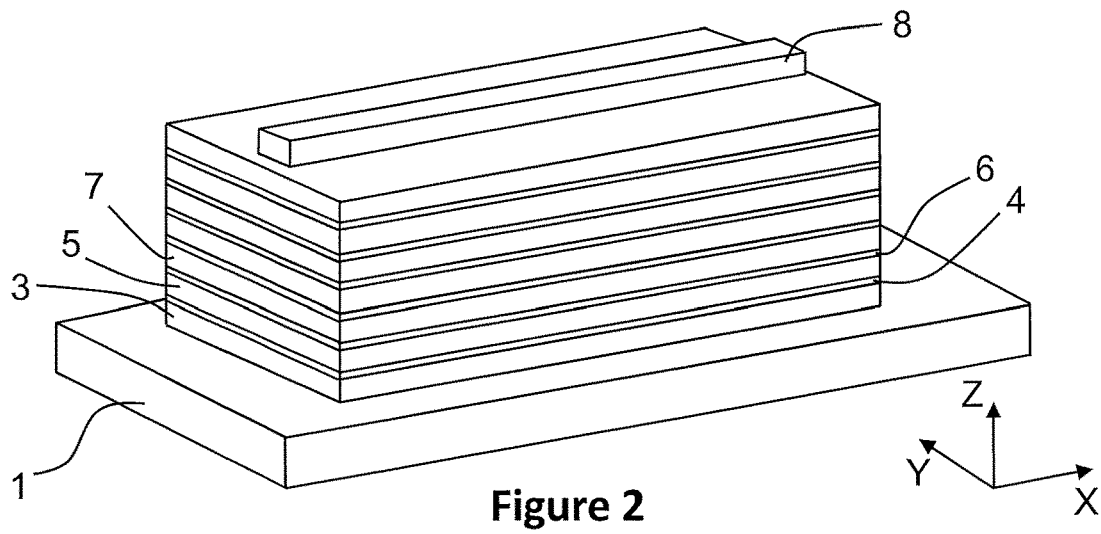

In these figures, unless stated otherwise, the same references have been used to reference elements that are the same.

Moreover, the elements shown in the figures are not to scale, to increase the legibility of the figures.

DESCRIPTION OF PARTICULAR EMBODIMENTS

In the present description, terms that depend on orientation, such as "above", "lateral", "longitudinal", "lower", "upper" and "under" relate to the orientation shown in FIGS. 1 to 19 with respect to the orthogonal coordinate system of axes X, Y, Z, the Z-axis pointing upward. Notably, the X-axis represents the "longitudinal" orientation and the Y-axis the "lateral" orientation. In particular, unless otherwise stated, a thickness is measured in a direction parallel to the Z-axis, a length is measured in a direction parallel to the X-axis, a lateral dimension, or width, is measured in a direction parallel to the Y-axis and a height is measured in a direction parallel to the Z-axis. The plane defined by the X and Y axes is a plane parallel to the substrate described below. A cross section, or a cross-sectional plane, that is "longitudinal" is cut in a plane parallel to the plane defined by the X and Z axes. A cross section, or a cross-sectional plane, that is "lateral" or "transverse" is cut in a plane parallel to the plane defined by the Y and Z axes. Below, a measurement along an axis or a direction may be taken parallel to this axis or this direction.

In the present description, because of measurement tolerances in the field of the invention, the term "parallel" may be replaced by "substantially parallel". Moreover, because of measurement tolerances in the field of the invention, the term "orthogonal" may be replaced by "substantially orthogonal".

In the present description, the expression "based on" may be understood to mean "mainly comprising" or, alternatively, "consisting of".

In the present description, the term nanowire or bar is understood to correspond to an element of elongate shape, whatever the shape of the profile of its transverse cross section. In this regard, the term nanowire may equally well mean nanoplate as nanobar.

The present invention differs from the prior art in that it provides an ingenious stack of semiconductor nanowires that may be easily used to form a field-effect transistor, in particular a pMOS type field-effect transistor, in which the flow of current in a channel area, also called the channel region in the field, is improved when the transistor operates because of this compressively stressed channel area. In other words, the expression "channel area" is understood, in the context of the present description, to correspond to an area in which a channel of the transistor will form during operation of the transistor. To achieve this end, provision is notably made to preserve parts, which are preferably compressively stressed and/or electrically doped, of an initial stack of nanowires, to allow charge carriers to be injected, or collected, at the level of (i.e. where appropriate into or from) the compressively stressed channel area of the transistor. If the aforementioned parts are compressively stressed, this compression comes from the initial stack but may, depending on the processing applied to the latter during the method for fabricating the transistor, be lower than that within the initial stack.

The method for fabricating a field-effect transistor, notably a pMOS transistor, comprises, as illustrated in FIG. 1, a step of forming, on a (i.e. on top of a) substrate 1, a stack 2 comprising successive first to fifth semiconductor nanowires 100, 200, 300, 400, 500. A stack 2 of nanowires is thus spoken of. Below, the term "method" refers to the fabricating method. Each of the first to fifth nanowires 100, 200, 300, 400, 500 is made of semiconductor, preferably crystalline semiconductor. Generally, depending on the nanowire in question, silicon or a silicon-germanium alloy is used by way of semiconductor material, however, the materials referred to as "III-V" materials may also be used. In the rest of the description, SiGe, or silicon-germanium, refers to the silicon-germanium alloy. By "successive first to fifth nanowires", what is meant is that the latter are superposed in such a way that the third nanowire 300 is located between, and in contact with, the second and fourth nanowires 200, 400, and that an assembly formed by the second to fourth nanowires 200, 300, 400 is located between the first and fifth nanowires 100, 500 so that the first nanowire 100 makes contact with the second nanowire 200, and so that the fifth nanowire 500 makes contact with the fourth nanowire 400. Notably, the stack 2 may be such that the first to fifth nanowires 100, 200, 300, 400, 500 are stacked such that the longitudinal axes of the first to fifth nanowires 100, 200, 300, 400, 500 are orthogonal to the stacking direction of the first to fifth nanowires 100, 200, 300, 400, 500, the stacking direction of the first to fifth nanowires 100, 200, 300, 400, 500 furthermore being orthogonal to the substrate 1, or more particularly to a face of the substrate 1 from which the stack 2 is formed. The stack 2 may also be said to rise, in its stacking direction, above the substrate 1.

Preferably, within the stack 2, the second and fourth nanowires 200, 400 are compressively stressed; in particular, it is a question of an axial compression along the longitudinal axis (parallel to the X-axis) of the second and fourth nanowires 200, 400. The compressive stress will have notably been obtained by adaptation of the lattice of the material constituting the second and fourth nanowires 200, 400. The first and fifth nanowires 100, 500 are, preferably, also compressively stressed along their longitudinal axes. In the present description, the compressive stress is preferably an axial stress along the X-axis or more particularly along an axis passing through the source and drain electrodes of the transistor. A stress that is said to be "along" an axis is notably parallel to this axis.

Thus, the first to fifth nanowires 100, 200, 300, 400, 500 are stacked such that the axes of elongation of the latter are parallel to one another and parallel to the plane of the substrate 1 (plane parallel to the plane defined by the axes XY) from which the stack 2 extends. Notably, for an assembly of first to fifth nanowires 100, 200, 300, 400, 500, the first nanowire 100 is closest to the substrate 1, and notably makes contact with the substrate 1 (in particular, where appropriate, for the assembly of first to fifth nanowires that is closest to the substrate 1 if the stack 2 comprises a plurality of assemblies of first to fifth nanowires as described below), and the fifth nanowire 500 is furthest from the substrate 1.

The substrate 1 is notably a silicon substrate, or a silicon-on-insulator substrate.

The material of the third nanowire 300 may be relaxed if it is silicon, in particular if the stack 2 of nanowires was obtained by epitaxial growth from a silicon substrate 1: in this case, the lattice parameter of the material of the third nanowire 300 tends to be equal to that of the substrate 1.

The stresses described in the present description are notably related to the lattice parameter of the material of the substrate 1, and to the lattice parameters of the materials within the nanowires of the stack 2.

In particular, the stack 2 may be obtained consecutively to the epitaxial growth of successive first to fifth layers 3, 4, 5, 6, 7 (FIG. 2) from the substrate 1 followed by etching, for example anisotropic dry etching, through a suitable mask 8, this leading to the obtainment of the stack shown in FIG. 1, the mask 8 having been removed therefrom. In particular, the thickness of each layer 3, 4, 5, 6, 7 (possibly excepting the layer made of silicon that is possibly intended to form the third nanowire 300) used to form the stack 2 is chosen such that it is smaller than the critical thickness of plastic relaxation of said layer to avoid stress relaxation, and to prevent the formation of defects within the stack 2.

Preferably, the thickness of the first and fifth layers 3, 7 may be comprised between 5 nm and 25 nm. The thickness of the second and fourth layers 4, 6 may be comprised between 1 nm and 5 nm. The thickness of the third layer 5 may be comprised between 2 nm and 15 nm. In other words, the step of forming the stack 2 may be such that the third nanowire 300 may have a thickness, measured in a stacking direction of the first to fifth nanowires 100, 200, 300, 400, 500, comprised between 2 nm and 15 nm, the second and fourth nanowires 200, 400 may each have a thickness, measured in the stacking direction of the first to fifth nanowires 100, 200, 300, 400, 500, comprised between 1 nm and 5 nm, and the first and fifth nanowires 100, 500 may each have a thickness, measured in the stacking direction of the first to fifth nanowires 100, 200, 300, 400, 500, comprised between 5 nm and 25 nm. The width of the first to fifth nanowires 100, 200, 300, 400, 500 may be comprised between 2 nm and 100 nm, and more particularly between 10 nm and 50 nm. The length of the first to fifth nanowires 100, 200, 300, 400, 500 is tailored to the fabricating method, it may be comprised between 30 nm and 10 µm. The given thicknesses in the present paragraph may, in order to ensure the desired stresses, be dependent on the atomic percentage of germanium in the layers comprising the silicon-germanium alloy, these percentages will be described below. The given thicknesses have the advantage of being compatible with the obtainment of a transistor, notably from a stack in which the first, second, fourth and fifth nanowires, 100, 200, 400, 500 are made of silicon-germanium, and the third nanowire 300 is made of silicon, as is described below.

Moreover, it will be understood from FIG. 1 that the stack 2 may comprise a plurality of assemblies E1, E2, E3 of first to fifth nanowires 100, 200, 300, 400, 500. In FIG. 1, there are three superposed assemblies E1, E2, E3. Two adjacent assemblies share one nanowire in common, such that the fifth nanowire of one of the adjacent assemblies forms the first nanowire of the other of the adjacent assemblies. The number of assemblies is non-limiting, and it is up to those skilled in the art to choose this number depending on the characteristics desired for the transistor.

The third nanowire 300 may comprise silicon; more particularly, the third nanowire 300 is said to be based on silicon or to be a silicon nanowire. Moreover, the first, second, fourth and fifth nanowires 100, 200, 400, 500 may each comprise silicon-germanium with an atomic percentage of germanium such as described below. To obtain the desired stresses while remaining below the aforementioned critical thickness, this percentage is related to the thickness of the nanowire in question. More particularly, the first, second, fourth and fifth nanowires 100, 200, 400, 500 are said to be based on SiGe or are SiGe nanowires. The advantage of using such materials is notably to allow them to be selectively etched, this facilitating the subsequent implementation of the method. Notably, the step of forming the stack 2 is such that the described features of the first to fifth nanowires 100, 200, 300, 400, 500 mentioned in this paragraph are obtained.

In particular, the proportion of germanium in the silicon-germanium of the first and fifth nanowires 100, 500 is strictly higher than the proportion of germanium in the silicon-germanium of the second and fourth nanowires 200, 400. This allows the first and fifth nanowires 100, 500 to be selectively etched with respect to the second and fourth nanowires 200, 400. Notably, the SiGe of the first and fifth nanowires 100, 500 comprises a proportion of germanium that is strictly 10 at % higher than the proportion of germanium in the SiGe of the second and fourth nanowires 200, 400. The difference between the proportion of germanium in the material of the first and fifth nanowires 100, 500 and in the material of the second and fourth nanowires 200, 400 may also be comprised between 15 at % and 20 at %. Preferably, the SiGe of the first and fifth nanowires 100, 500 comprises a proportion of germanium comprised between 25 at % and 50 at % (the composition of the SiGe may then be said to be variable between that of $Si_{0.75}Ge_{0.25}$ and that of $Si_{0.5}Ge_{0.5}$) and the SiGe of the second and fourth nanowires 200, 400 comprises a proportion of germanium comprised between 10 at % and 40 at % (the composition of the SiGe may then be said to be variable between that of $Si_{0.9}Ge_{0.1}$ and that of $Si_{0.6}Ge_{0.4}$). In the present description "at %" corresponds to the atomic percentage.

Figure 3:
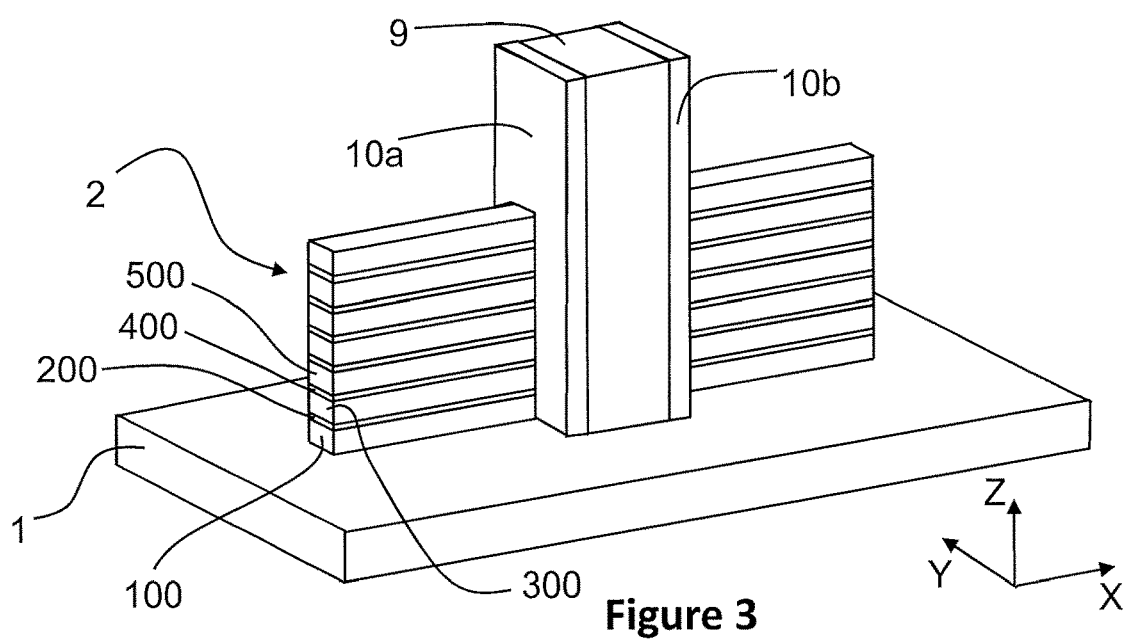
Figure 4:
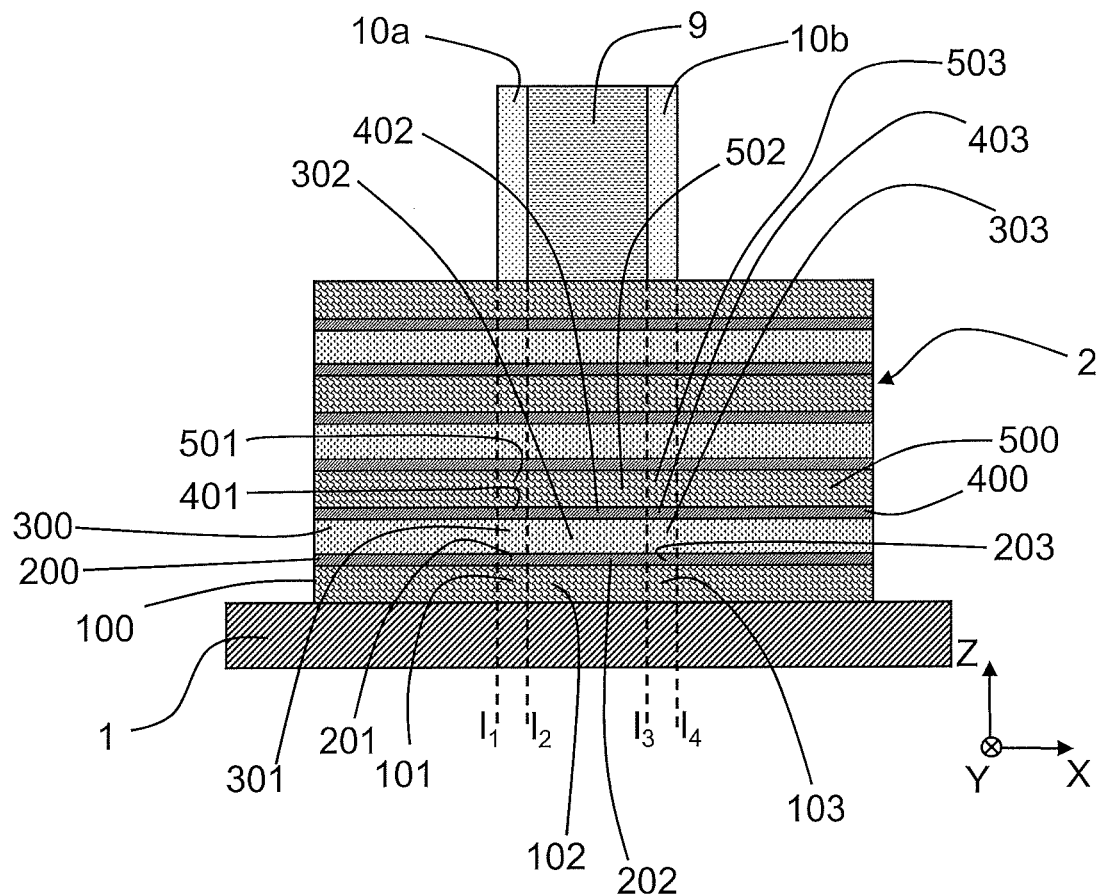
FIG. 4 is a view of a longitudinal cross section of FIG. 3.

The fabricating method furthermore comprises, as illustrated in FIG. 3, a step of producing a sacrificial gate 9 and first and second spacers 10a, 10b. These first and second spacers 10a, 10b are arranged on either side of the sacrificial gate 9, and in particular make contact with the sacrificial gate 9. In the field, the first and second spacers 10a, 10b are also called external spacers 10a, 10b. The role of these first and second spacers 10a, 10b is to participate, preferably in combination with internal spacers, which will be described in more detail below, in the electrical insulation of the future gate electrode of the transistor from the future source and drain electrodes of the transistor. The first and second spacers 10a, 10b are therefore electrically insulating. The sacrificial gate 9 and the first and second spacers 10a, 10b cover a part of the stack 2 comprising first, second and third parts of each of the first to fifth nanowires 100, 200, 300, 400, 500, as shown in FIG. 4, which shows a longitudinal cross section of FIG. 3, and in which the (dotted) lines $l_1$, $l_2$, $l_3$, $l_4$ allow the locations of the aforementioned first, second and third parts to be seen. In other words, each of the first to fifth nanowires 100, 200, 300, 400, 500 comprises a first part 101, 201, 301, 401, 501 that is located under the first spacer 10a, a second part 102, 202, 302, 402, 502 that is located under the sacrificial gate 9, and a third part 103, 203, 403, 503 that is located under the second spacer 10b. In FIG. 4, the first parts 101, 201, 301, 401, 501 of the first to fifth nanowires 100, 200, 300, 400, 500 are located between the lines $l_1$ and $l_2$ (notably under the first spacer 10a). The second parts 102, 202, 302, 402, 502 of the first to fifth nanowires 100, 200, 300, 400, 500 are located between the lines $l_2$ and $l_3$ (notably under the sacrificial gate 9) and the third parts 103, 203, 303, 403, 503 of the first to fifth nanowires 100, 200, 300, 400, 500 are located between the lines $l_3$ and $l_4$ (notably under the second spacer 10b).

For each of the first to fifth nanowires 100, 200, 300, 400, 500, its second part 102, 202, 302, 402, 502 is located between its first part 101, 201, 301, 401, 501 and its third part 103, 203, 303, 403, 503, and notably its second part 102, 202, 302, 402, 502 connects its first part 101, 201, 301, 401, 501 to its third part 103, 203, 303, 403, 503. Thus, for one and the same nanowire, and when the first to third parts thereof are present, the first and third parts of the nanowire are formed in continuity with the second part of the nanowire. In particular, the first, second and third parts of a given nanowire lie in succession along the longitudinal axis of said given nanowire.

At the stage of FIGS. 3 and 4, the first, second, fourth and fifth nanowires 100, 200, 400, 500 are, when they are made of silicon-germanium, each compressively stressed along their longitudinal axis. Moreover, at the stage of FIGS. 3 and 4, the third nanowire 300, when it is made of silicon, is relaxed, because the silicon of the third nanowire 300 still has the lattice parameter of the substrate 1, or substantially relaxed because of a slight stress via a Poisson effect.

More particularly, the sacrificial gate 9 is formed, before the first and second spacers 10a, 10b are produced, in the desired location of a future gate electrode of the transistor. The sacrificial gate 9 may be formed via a lithography step and an etching step. The sacrificial gate 9 notably extends from the substrate 1, and covers a part of the lateral flanks of the stack 2 (FIGS. 3 and 4) and a corresponding part of the top of the stack 2. Moreover, the sacrificial gate 9 is such that the second parts 102, 202, 302, 402, 502 of the first to fifth nanowires 100, 200, 300, 400, 500 are located under the sacrificial gate 9. The sacrificial gate 9 may be based on, polycrystalline or amorphous, silicon-germanium or silicon. Along the X-axis, i.e. parallel to the elongation of the first to fifth nanowires 100, 200, 300, 400, 500, the sacrificial gate 9 may have a dimension for example comprised between 5 nm and 150 nm and the height along the Z-axis of the sacrificial gate 9 may be such that it is taller than the stack 2 by 30 nm to 150 nm. The width of the sacrificial gate 9 along the Y-axis must be larger than the nanowires of the stack 2.

The first and second spacers 10a, 10b are for example produced by conformal deposition of a suitable material, then etching of this suitable material so that the first and second spacers 10a, 10b make contact with the sacrificial gate 9 and cover corresponding parts of the lateral flanks of the stack 2 and corresponding parts of the top of the stack 2. The etch of this suitable material may be an anisotropic etch. The first and second spacers 10a, 10b may be made of a dielectric, they may for example be based on SiN (silicon nitride) or SiBCN (silicon-boron-carbon nitride). Along the X-axis, i.e. parallel to the axes of elongation of the nanowires, the first and second spacers 10a, 10b may each have a dimension for example comprised between 3 nm and 20 nm, the height along the Z-axis of the first and second spacers 10a, 10b may be identical to that of the sacrificial gate 9, the width of the first and second spacers 10a, 10b along the Y-axis may be identical to that of the sacrificial gate 9.

Figure 11:
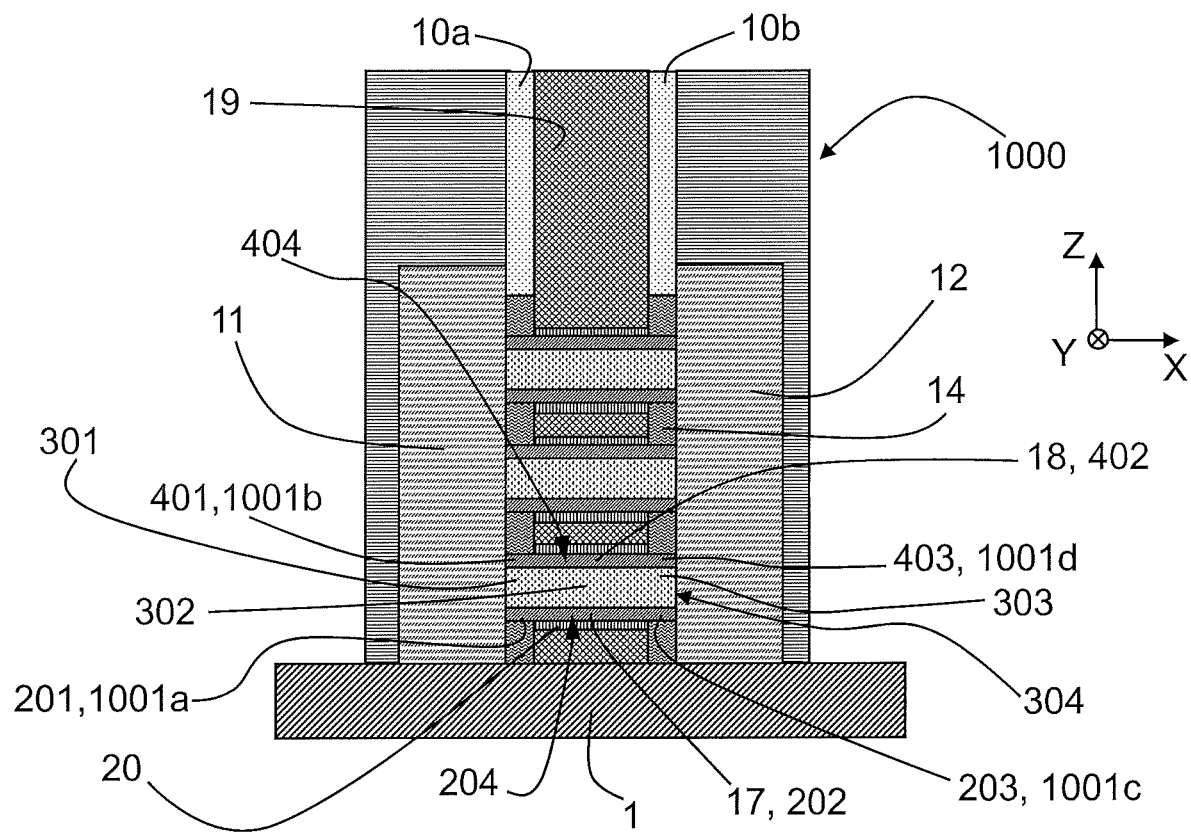
FIG. 11 shows, according to a view of a longitudinal cross section, a transistor obtainable at the end of the fabricating method according to a first particular embodiment.
Figure 12:
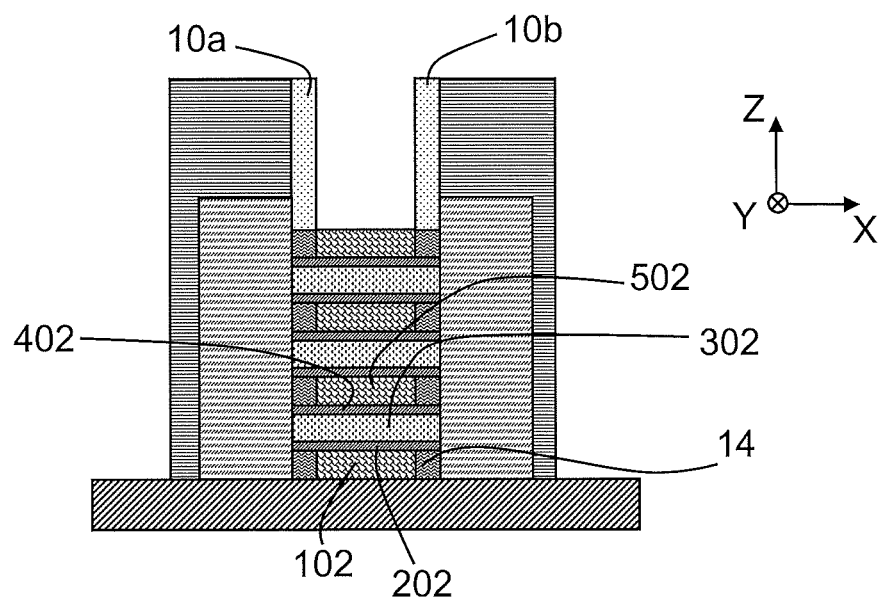
FIGS. 12 to 13 illustrate views of longitudinal cross sections of the transistor during various steps of its fabricating method.

Generally, the method may comprise, after the first and second spacers 10a, 10b and the sacrificial gate 9 have been formed, a step of removing the sacrificial gate 9, notably by etching the material that it comprises, which results in the second parts 102, 202, 302, 402, 502 of the first to fifth nanowires 100, 200, 300, 400, 500 being revealed and being made accessible, notably in a region located between the first and second spacers 10a, 10b (as shown in FIG. 12). This step of removing the sacrificial gate 9 is notably carried out after the source and drain electrodes have been formed, and notably after internal spacers have been formed, the way in which these electrodes and spacers are formed being described below. The etch that allows the sacrificial gate 9 to be removed may be a dry etch or a wet etch, or even a dry etch followed by a wet etch, this etch or etches being tailored to the material forming the sacrificial gate 9. Next, after the step of removing the sacrificial gate 9, the method comprises a step of removing the second parts 102, 502 of the first and fifth nanowires 100, 500 (FIG. 13), which second parts are made accessible by the step of removing the sacrificial gate 9. This step of removing the second parts 102, 502 of the first and fifth nanowires 100, 500 results in the suspension of an assembly formed by the second parts 202, 302, 402 of the second to fourth nanowires 200, 300, 400 between the first and second spacers 10a, 10b. This removal of the second parts 102, 502 of the first and fifth nanowires 100, 500 may be achieved by etching the second parts 102, 502 of the first and fifth nanowires 100, 500, this etching being said to be selective because only the material of the first and fifth nanowires 100, 500 is etched. This step of selectively etching the second parts 102, 502 of the first and fifth nanowires 100, 500 may be a dry-etching step, for example based on a diluted HCl (hydrochloric-acid). Next, the fabricating method comprises a step of producing a gate electrode 19 (shown in FIGS. 11 and 18, which will be described in more detail below) of the transistor, for example by depositing a suitable material between the first and second spacers 10a, 10b and around a compressively stressed channel area 17 of the transistor, which channel area is distinct from the second part 302 of the third nanowire 300. A gate insulator is notably interposed between the channel area 17 and the gate electrode 19. The channel area 17 notably makes contact with the second part 302 of the third nanowire 300. This channel area 17 is connected to the source electrode 11 of the transistor by the first part 201 of the second nanowire 200, and to the drain electrode 12 of the transistor by the third part 203 of the second nanowire 200. The channel area 17 is thus arranged along the second part 302 of the third nanowire 300, notably in the region located between the first and second spacers 10a, 10b. It will thus be understood that the first and third parts 201, 203 of the second nanowire 200 will be able to participate in the movement of charge carriers in the channel area 17, either by promoting their injection or by promoting their collection. Moreover, since the channel area 17 is compressed, notably axially, it will be understood that the channel area is distinct from the third nanowire, it is notably this point that allows a compressed channel area 17, in particular formed on the second part 302 of the third nanowire 300, to be obtained. In other words, more generally, the method for fabricating the transistor may comprise a step of forming the channel area 17, which channel area is compressively stressed and distinct from the second part 302 of the third nanowire 300, this channel area 17 notably being formed in the second part 302 of the third nanowire 300, the channel area 17 being connected to the source electrode 11 and drain electrode 12 in the way described above. In other words, the second part 302 of the third nanowire 300 is able to serve as a matrix for the channel area 17 and the second part 302 of the third nanowire 300 makes it possible to ensure that the compressive stress in the channel area 17 is maintained. As will be seen below, this channel area 17 may then be formed by preserving the second part 202 of the second nanowire 200, or by forming a sleeve 21 (FIG. 18) around the second part 302 of the third nanowire 300 after its freeing.

The gate electrode 19 may be produced by conformal deposition of ALD (Atomic Layer Deposition) type. The gate electrode 19 may be formed on a gate insulator 20 (FIGS. 11 and 18) that is formed, beforehand, in succession, by an interface oxide, for example silicon oxide ($SiO_2$), of a thickness ranging from the thickness of one atomic layer of said oxide to 2 nm, then by deposition of a high-k dielectric e.g. hafnium oxide ($HfO_2$) or other with a thickness comprised between 1 nm and 3 nm. The gate electrode 19 may be formed on the gate insulator 20 by depositing a metal for example titanium nitride (TiN) with a 5 nm thickness, then tungsten or a doped polysilicon in order to fill the volume of the cavity left free by the removal of the sacrificial gate 9. Other suitable materials known to those skilled in the art may also be used to form this gate electrode 19.

Notably, the material of the second and fourth nanowires 200, 400 have chemical elements in common with the channel area 17 of the transistor. In particular, the channel area 17 is formed by a material comprising silicon-germanium, just like the second and fourth nanowires 200, 400. This allows electrical conduction between the first and third parts of the second nanowire and/or of the fourth nanowire to be promoted with a corresponding channel area, to prevent charge carriers from having to overcome an energy barrier.

Figure 5:
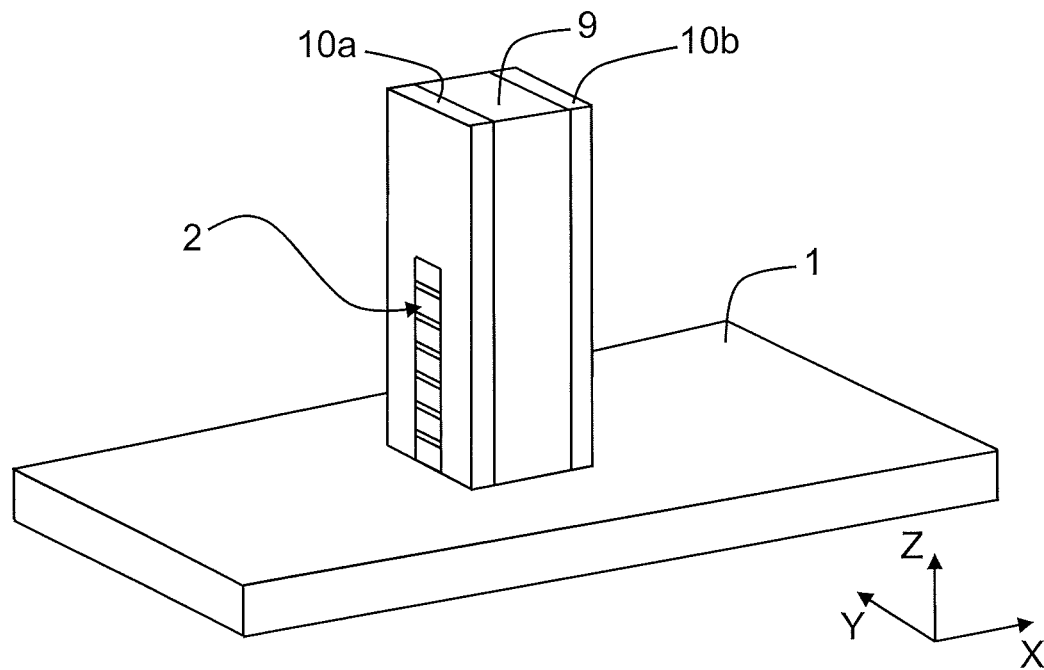
FIG. 5 is a perspective view of a structure used during the fabricating method.
Figure 6:
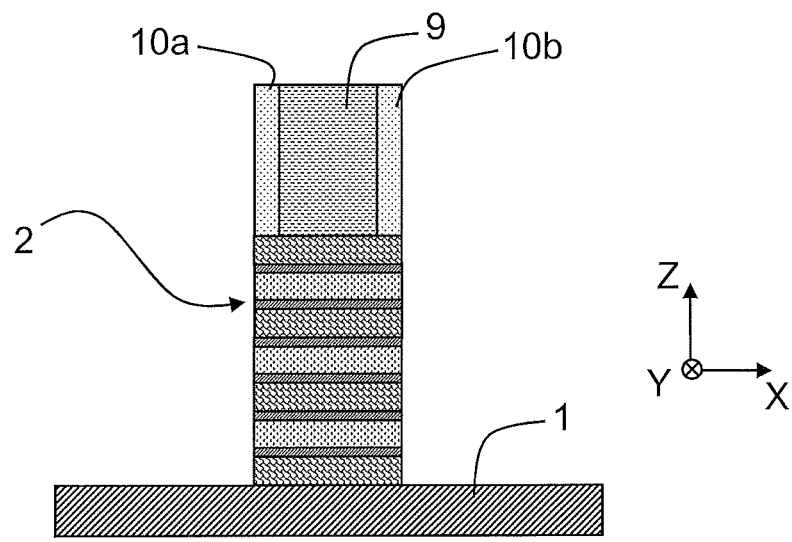
FIG. 6 illustrates a view of a longitudinal cross section of FIG. 5.
Figure 7:
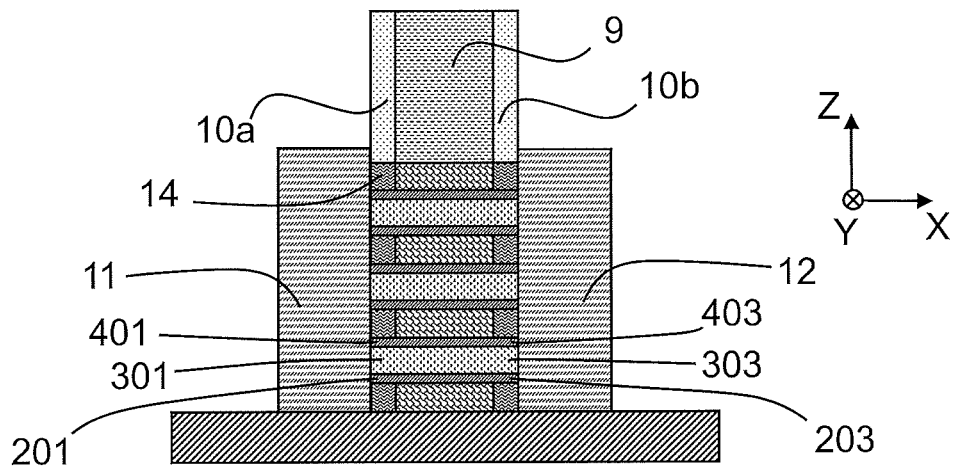
FIG. 7 illustrates a view of a longitudinal cross section of the transistor during its fabrication showing the production of source and drain electrodes.

Preferably, after the step of producing the sacrificial gate 9 and the first and second spacers 10a, 10b (FIGS. 3 and 4), the method comprises a step of removing portions of the stack 2, notably by etching, for example dry anisotropic etching, in such a way as to preserve that part of the stack 2 that is covered by the sacrificial gate 9 and by the first and second spacers 10a, 10b (FIGS. 5 and 6). In other words, the part of the stack 2 which is covered by the sacrificial gate 9 and by the first and second spacers 10a, 10b (and notably only this part of the stack 2) is preserved. In other words, the portions of the stack 2 which are arranged in continuity with that part of the stack 2 that is covered by the sacrificial gate 9 and the first and second spacers 10a, 10b are removed. This etching of the stack 2 may be carried out as far as to the substrate 1 (FIGS. 5 and 6) or continue into the substrate (not shown). After the portions of the first to fifth nanowires 100, 200, 300, 400, 500 which extended beyond where the stack 2 is covered with the covering formed by the first and second spacers 10a, 10b and the sacrificial gate 9 have been removed, the method may comprise a step of producing/forming source and drain electrodes 11, 12 (FIG. 7) on either side of a structure comprising the sacrificial gate 9 and the first and second spacers 10a, 10b, in such a way that the source electrode 11 makes contact with the first parts 201, 301, 401 of the second, third and fourth nanowires 200, 300, 400, and that the drain electrode 12 makes contact with the third parts 203, 303, 403 of the second, third and fourth nanowires 200, 300, 400. This advantageously allows, in the end, the source electrode 11 and drain electrode 12 to be connected to one or more channel areas in which current flow is promoted. The source and drain electrodes 11, 12 may be formed by epitaxial growth of a suitable material from the free ends of what remains of the second to fourth nanowires 200, 300, 400 under the covering formed by the sacrificial gate 9 and the first and second spacers 10a, 10b. If it is desired to form a pMOS transistor, SiGe doped in situ with boron may be grown to form the source and drain electrodes 11, 12. The dimensions of the electrodes will be chosen depending on the available space.

Figure 8:
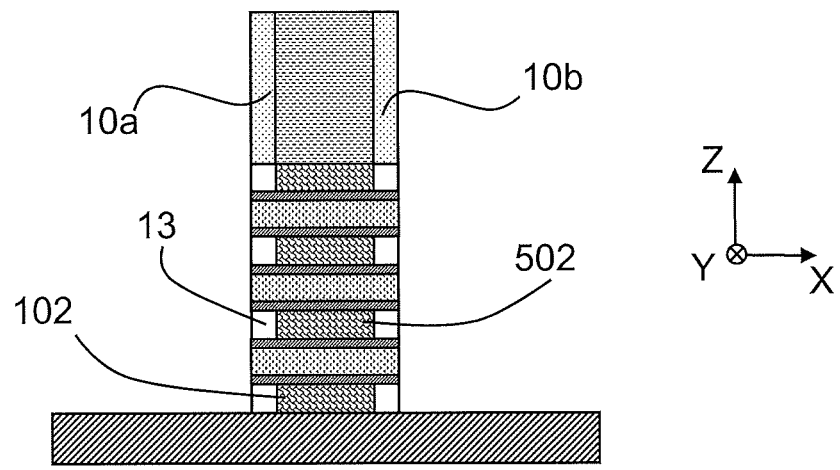
FIGS. 8 and 9 are views of longitudinal cross sections of the transistor during its fabrication showing the production of internal spacers.
Figure 9:
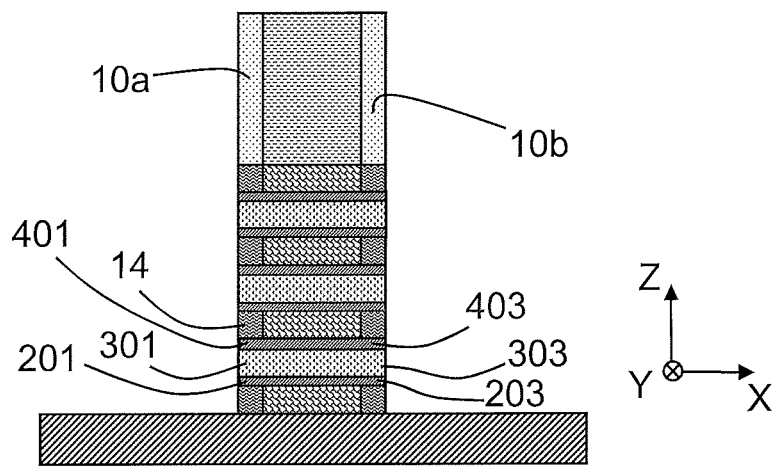
Figure 10:
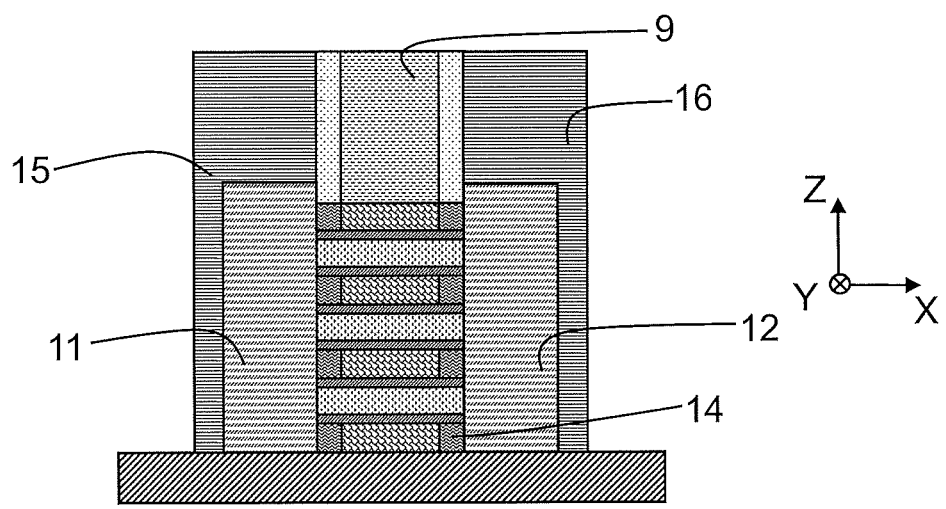
FIG. 10 illustrates, according to a view of a longitudinal cross section, an encapsulation of the source and drain electrodes of the transistor during its fabrication.

In particular, it is also sought to form internal spacers, production of which is known per se. FIGS. 8 and 9 show how the internal spacers are incorporated in the context of the fabricating method. These spacers are said to be "internal" spacers because they are formed under the first and second spacers 10a, 10b, notably replace the first and third parts 101, 501, 103, 503 of the first and fifth nanowires 100, 500. Thus, the method may comprise, between the step of removing portions of the stack 2 which are located beyond the covering made/formed by the sacrificial gate 9 and the first and second spacers 10a, 10b, and the step of producing the source electrode 11 and drain electrode 12 of FIG. 7, a step of removing all or some of the first and third parts 101, 103, 501, 503 of the first and fifth nanowires 100, 500 (in FIG. 8 only the second parts 102, 502 of the first and fifth nanowires 100, 500 remain) located under the first and second spacers 10a, 10b so as to form cavities 13. Next, the method comprises a step of filling the cavities 13 with an electrical insulator (FIG. 9), such as a dielectric material, to form internal spacers 14 that are intended to separate and electrically insulate the gate electrode 19 of the transistor from the source and drain electrodes 11, 12 of the transistor. This notably allows the appearance of parasitic capacitances to be prevented, such as was described in the summary of the prior art. The step of removing all or some of the first and third parts 101, 103, 501, 503 of the first and fifth nanowires 100, 500 may be carried out here by a selective horizontal etch that etches only the material of the first and third parts 101, 103, 501, 503 of the first and fifth nanowires 100, 500, this etch may be dry or wet. The filling step may be carried out via conformal deposition of the material intended to form the internal spacers 14, then by etching of the latter so as to leave it only in the aforementioned cavities 13. The material used to form the internal spacers 14 may be silicon nitride (SiN). The material deposited to form the internal spacers 14 is etched so as to expose ends that are then formed by faces of the first and third parts 201, 301, 401, 203, 303, 403 of the second to fourth nanowires 200, 300, 400 (FIG. 9). The internal spacers 14 may also be seen in FIGS. 7, 10, 11, 12, 13, 15, 16, 17 and 18. Next, the step of producing the source and drain electrodes 11, 12 may be carried out as described above (FIG. 7). These source and drain electrodes 11, 12 are then encapsulated (FIG. 10) in protective masks 15, 16, this allowing deterioration of the electrodes in subsequent technological steps to be avoided.

The stack described above may be judiciously used to form channel areas of the transistor with the second parts of the second and fourth nanowires directly, or to form a channel area by subsequent growth of a suitable material after removal of the second parts of the second and fourth nanowires.

The first and third parts 201, 401, 203, 403 of the second and fourth nanowires 200, 400 respectively allow the source electrode 11 to be connected to a corresponding channel area and the drain electrode 12 to be connected to a corresponding channel area. If they are electrically doped, these first and third parts 201, 401, 203, 403 of the second and fourth nanowires 200, 400 may be called extension regions of the source and drain 11, 12, respectively. This electrical doping may be achieved by thermal diffusion of dopants present in the source and drain electrodes after formation thereof, or alternatively during the deposition of the layers intended to form the second and fourth nanowires.

Figure 13:
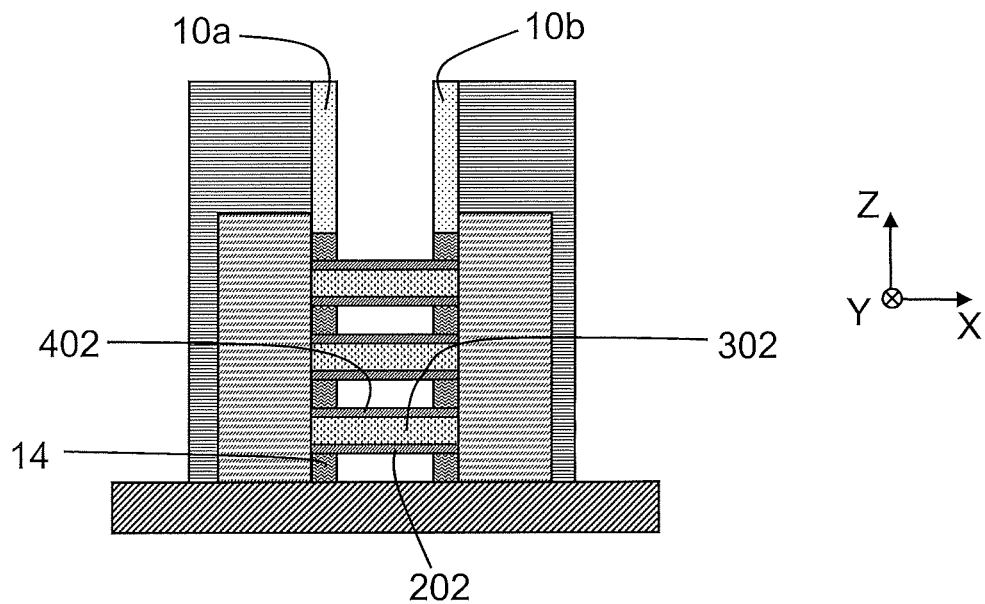
Figure 14:
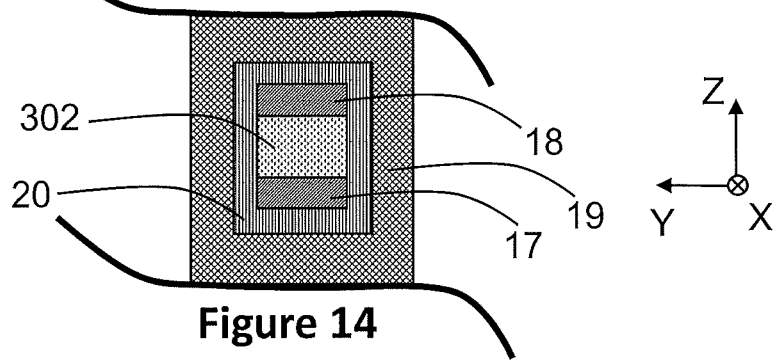
FIG. 14 is a view of a lateral cross section cut between external spacers according to the first particular embodiment of the fabricating method and therefore of the transistor.

According to a first particular embodiment illustrated in FIG. 11, the step of forming the stack 2 is such that the second and fourth nanowires 200, 400 are compressively stressed, and said channel area of the transistor is a first channel area 17 formed by the second part 202 of the second nanowire 200 connecting the first and third parts 201, 203 of the second nanowire 200. In this sense, it will be understood that the step of forming the channel area 17 here consists in preserving the second part 202 of the second nanowire 200 coming from the stack 2 of nanowires. In other words, the step of forming the channel area 17 (notably here the first channel area 17) may comprise the formation of an element that is formed during the formation of the stack 2, i.e. the step of forming the channel area 17 may comprise the formation of the second part 202 of the second nanowire. Moreover, in this case, a compressively stressed second channel area 18 of the transistor is formed by the second part 402 of the fourth nanowire 400 connecting the first and third parts 401, 403 of the fourth nanowire 400. It may then be said that the method may comprise a step of forming the second channel area 18 such as described. In other words, the step of forming the second channel area 18 may comprise the formation of an element that is formed during the formation of the stack 2, i.e. the step of forming the second channel area 18 may comprise the formation of the second part 402 of the fourth nanowire 400. Thus, the first part 401 of the fourth nanowire 400 connects the source electrode 11 to the second part 402 of the fourth nanowire 400, and the third part 403 of the fourth nanowire 400 connects the drain electrode 12 to the second part 402 of the fourth nanowire 400. The second part 302 of the third nanowire 300 is arranged between the second parts 202, 402 of the second and fourth nanowires 200, 400. Moreover, the step of producing the gate electrode 19 is such that said gate electrode 19 formed between the first and second spacers 10a, 10b surrounds an assembly formed by a superposition of the second parts 202, 302, 402 of the second to fourth nanowires 200, 300, 400, notably with interposition of a gate insulator 20. This first particular embodiment has the advantage of taking advantage of the presence of the first to third parts 201, 202, 203, 401, 402, 403 of the second and fourth nanowires 200, 400 to form two compressively stressed channel areas 17, 18 that are obtained directly from the initial stack 2 of nanowires. To obtain the subject matter of FIG. 11, it is possible to start with the structure in FIG. 10, then to implement the step of removing the sacrificial gate 9 (FIG. 12), which results in the second parts 102, 202, 302, 402, 502 of the first to fifth nanowires 100, 200, 300, 400, 500 being revealed, notably in the region located between the first and second spacers 10a, 10b. Next, the step of removing/etching (selectively, in order not to remove the other nanowire parts made of silicon or having a different germanium content) the second parts 102, 502 of the first and fifth nanowires 100, 500 is implemented (FIG. 13), which results in the suspension of a superposition of the second parts 202, 302, 402 of the second to fourth nanowires 200, 300, 400. Lastly, the step of forming the gate electrode 19 (FIG. 11) is implemented, notably after a gate insulator 20 has been formed around the first and second channel areas 17, 18. FIG. 14 is a view of a partial transverse cross section cut in a cross-sectional plane located between the first and second spacers 10a, 10b, allowing the first channel area 17 and the second channel area 18 to be seen, the latter being separated from the first channel area 17 by the second part 302 of the third nanowire 300. The gate insulator 20 then forms a sleeve that connects the first and second spacers 10a, 10b and that surrounds, notably with contact, the superposition including the first channel area 17, the second part 302 of the third nanowire 300 and the second channel area 18. The gate electrode 19 is then coated onto the gate insulator 20: the gate electrode 19 then makes contact with the gate insulator 20.

For technological reasons to do with ensuring the material of the first and fifth nanowires 100, 500 can be etched selectively with respect to the material of the second and fourth nanowires 200, 400, the proportion of germanium is lower in the second and fourth nanowires 200, 400 than in the first and fifth nanowires 100, 500. Thus, even though after the second parts 102, 502 of the first and fifth nanowires 100, 500 have been removed, notably by etching, the second parts 202, 402 of the second and fourth nanowires 200, 400 remain compressively stressed, there may be a need to further improve the stress of the channel area with respect to that the first particular embodiment makes it possible to obtain.

Figure 15:
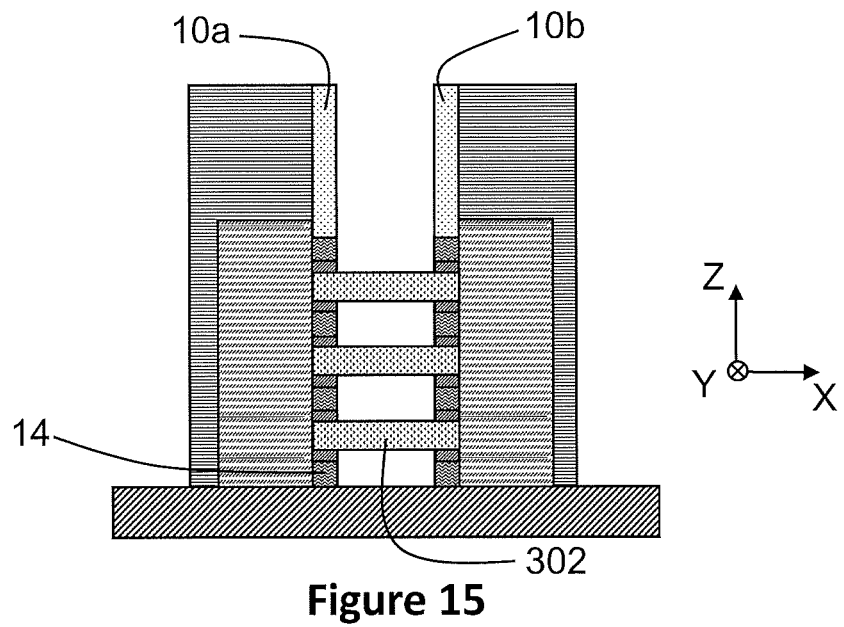
FIGS. 15 to 18 illustrate views of longitudinal cross sections showing steps of the fabricating method allowing a transistor according to a second particular embodiment to be obtained.
Figure 16:
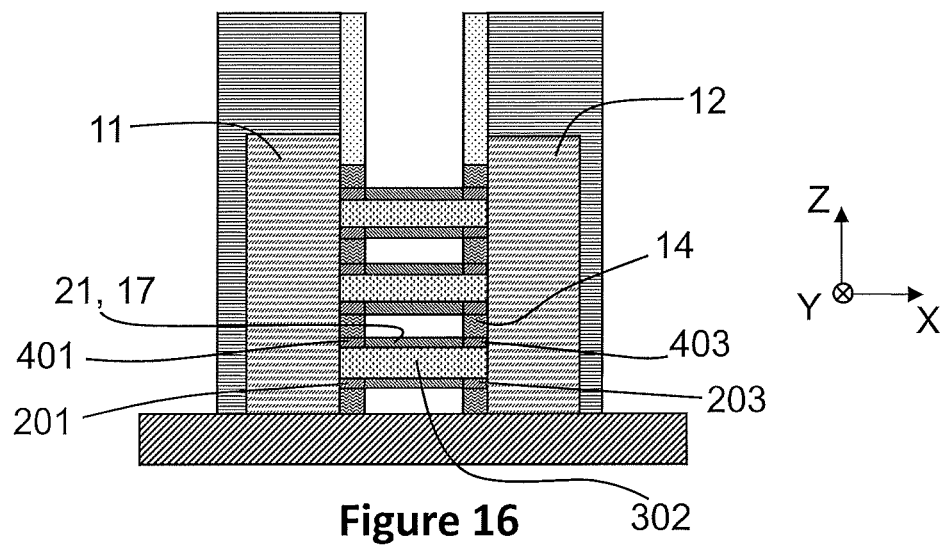
Figure 17:
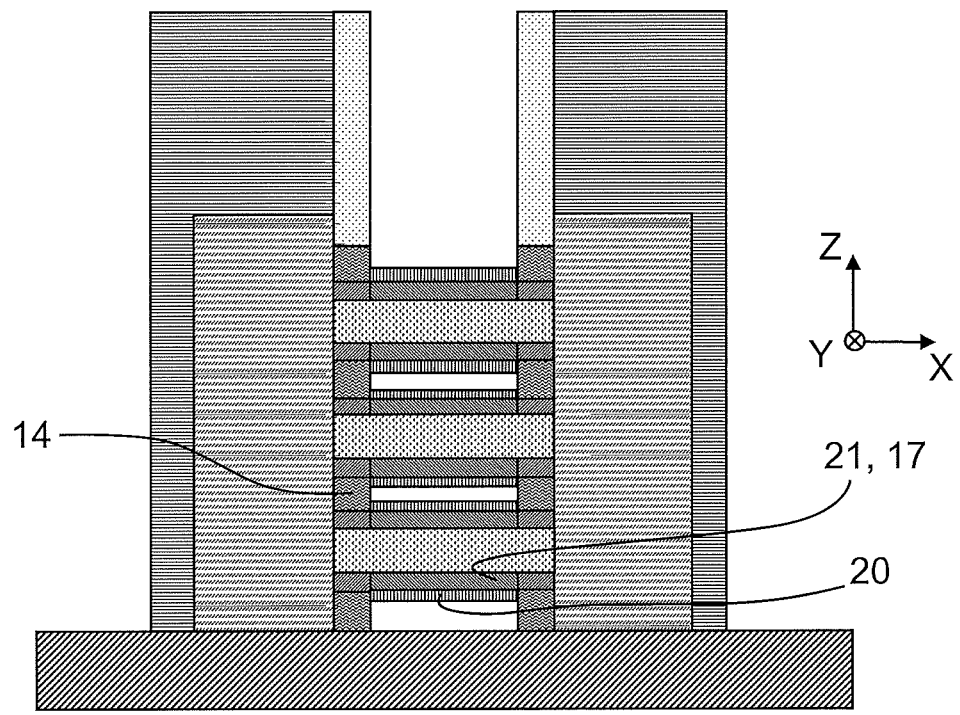

To meet the need expressed in the preceding paragraph, a second particular embodiment will now be described in which the method comprises, notably after the step of removing the sacrificial gate 9 (for example as illustrated in FIG. 12) and preferably after the step of removing the second parts 102, 502 of the first and fifth nanowires 100, 500 (FIG. 13), a step of removing, notably by etching, for example based on an HCl that is sensitive to the germanium content of the material that it is desired to remove, the second parts 202, 402 of the second and fourth nanowires 200, 400, which second parts are made accessible between the first and second spacers 10a, 10b: the second parts 202, 402 of the second and fourth nanowires 200, 400 present in the region located between the first and second spacers 10a, 10b (FIG. 15) are notably said to be removed. This step of removing the second parts 202, 402 of the second and fourth nanowires 200, 400 is notably carried out after the step of removing the second parts 102, 502 of the first and fifth nanowires 100, 500 (in this way passes from FIG. 12 to FIG. 13 and then to FIG. 15). As a result of this step in which the second parts 202, 402 of the second and fourth nanowires 200, 400 are removed, the second part 302 of the third nanowire 300 is freed, between the first and second spacers 10a, 10b and notably along its longitudinal axis. By "free", what is meant is that the surface of the second part 302 of the third nanowire 300 extending between the first and second spacers 10a, 10b becomes accessible, this freeing notably allowing the lateral, upper and lower faces of the second part 302 of the third nanowire 300 to be made accessible. The second part 302 of the third nanowire 300 is then suspended between the first and second spacers 10a, 10b (FIG. 15). Next, the method, and more particularly the step of forming the channel area 17 of the transistor, comprises a step of epitaxially growing a material (FIG. 16), notably conformally, from the second part 302 of the third nanowire 300, to form the compressively stressed channel area 17, this compressive stress being induced by the second part 302 of the third nanowire 300, notably along its longitudinal axis. The compressive stress is notably obtained by matching of the lattice parameter of the material that is grown from the second part 302 of the third nanowire 300 during the epitaxial growth. The channel area 17 obtained, preferably, then makes contact with the first and third parts 201, 401, 203, 403 of the second and fourth nanowires 200, 400, which then ensure the electrical continuity with the source electrode 11 and drain electrode 12 (FIG. 16). In other words, at the end of the step of growing the material epitaxially, the first part 401 of the fourth nanowire 400 connects the channel area 17 to the source electrode 11, and the third part 403 of the fourth nanowire 400 connects the channel area 17 to the drain electrode 12. Moreover, at the end of the step of growing the material epitaxially, the first part 201 of the second nanowire 200 connects the channel area 17 to the source electrode 11, and the third part 203 of the second nanowire 200 connects the channel area 17 to the drain electrode 12. In particular, the growth of this material epitaxially allows a sleeve 21 forming the channel area 17 to be formed. The compressive stress in the channel area 17, notably in the sleeve 21, is, where appropriate, strictly higher than the compressive stress in the second parts 202, 402 of the second and fourth nanowires 200, 400 before their removal. For example, the channel area 17, or the sleeve 21, is said to be formed by epitaxial growth of a material having a lattice parameter, in the relaxed state, that is larger than:

the lattice parameter in the relaxed state of the material of the second nanowire 200, the current lattice parameter of the material of the second part 302 of the third nanowire 300, the lattice parameter in the relaxed state of the material of the fourth nanowire 400.

This therefore allows, in the pMOS case, a higher-performance transistor to be formed by improving the compressive stress in the channel area 17. In a transverse cross-sectional plane, the sleeve 21 has a closed profile. Alternatively, the sleeve 21 may be replaced by an element not having a closed profile—in this respect it is only necessary for this element to ensure electrical continuity between the first parts 201, 401 of the second and fourth nanowires 200, 400 and the third parts 203, 403 of the second and fourth nanowires 200, 400. According to one example, the sleeve 21 is made of SiGe that may comprise between 30 at % and 50 at % of germanium, this resulting in a stress, in the channel area formed by the sleeve 21, that is suitable for forming a high-performance transistor.

The material of the sleeve 21 notably comprises SiGe, or is based on SiGe, or is made of SiGe. When the first and third parts 201, 401, 203, 403 of the second and fourth nanowires 200, 400 comprise germanium in an alloy with silicon, the proportion of germanium in the SiGe of the sleeve 21 is, preferably, strictly higher than that in the alloy used to form the first and third parts 201, 401, 203, 403 of the second and fourth nanowires 200, 400. Here, the first and third parts 201, 401, 203, 403 of the second and fourth nanowires 200, 400 allow a good electrical conduction to the sleeve 21 since there is no barrier to overcome and as a similar material to that of the sleeve 21 was used. By similar material, what is meant is the use of the same chemical elements, such as silicon and germanium, but in atomic percentages that may vary.

In the context of the second particular embodiment, the step of growing the material epitaxially is such that the channel area 17 has a thickness, in a direction normal to the surface of the second part 302 of the third nanowire 300, of about, or equal to, the thickness of the second and fourth nanowires 200, 400, this thickness being measured in the stacking direction of the first to fifth nanowires 100, 200, 300, 400, 500. This allows the sleeve 21 to self-align with the remaining first parts 201, 401 of the second and fourth nanowires 200, 400, and with the remaining third parts 203, 403 of the second and fourth nanowires 200, 400. The advantage of this self-alignment is that it allows the junction between the materials of the source and drain electrodes 11, 12 with the channel area 17 to be optimized. Here, the channel area 17 makes contact with the first parts 201, 401 and the third parts 203, 403 of the second and fourth nanowires 200, 400.

Figure 18:
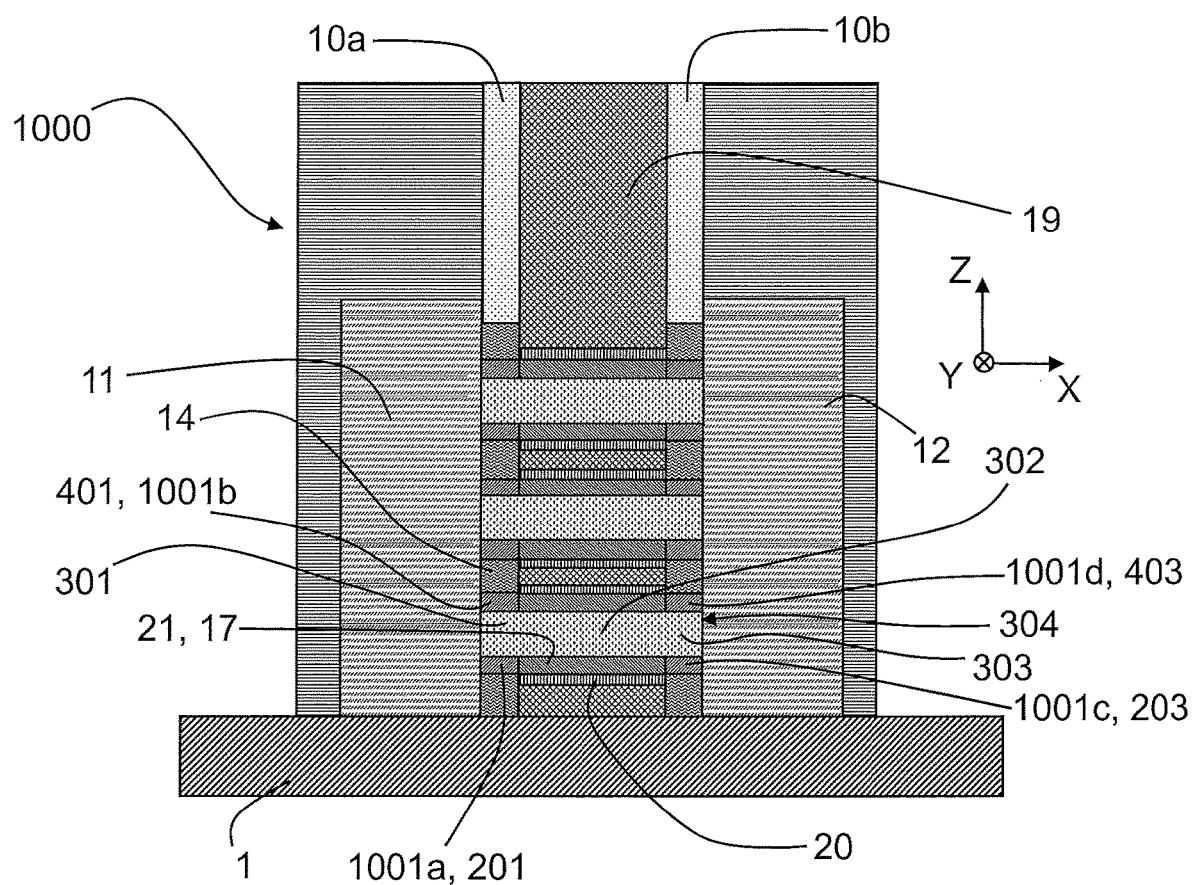
Figure 19:
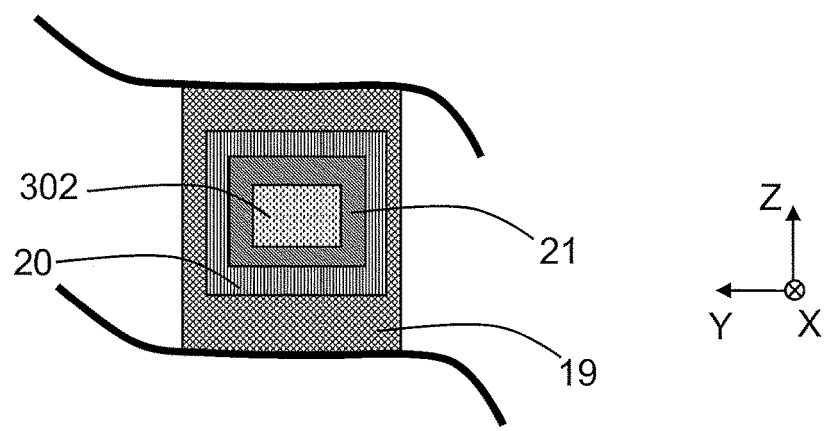
FIG. 19 is a view of a lateral cross section cut between the external spacers of the second particular embodiment of the fabricating method and therefore of the transistor.

In the context of this second particular embodiment, and notably in the same way as in the first particular embodiment, it is then possible to form a gate insulator 20 around the channel area 17, notably around the sleeve 21 (FIG. 17), then the gate electrode 19 (FIG. 18). FIG. 19 is a view of a partial transverse cross section cut in a cross-sectional plane located between the first and second spacers 10*a*, 10*b* allowing the channel area formed by the sleeve 21 to be seen. The gate insulator 20 may be formed by depositing a suitable material so that it has, in a transverse cross-sectional plane, a closed sectional profile. The gate insulator 20 is coated onto the sleeve 21 and connects the first and second spacers 10*a*, 10*b*, then the gate electrode 19 is coated in turn onto the gate insulator 20, the second part 302 of the third nanowire 300 being located at the centre.

According to one improvement applicable to the second particular embodiment, the second and fourth nanowires 200, 400 of the stack 2 are electrically doped (in particular p-doped), preferably with boron. This electrical doping allows the flow of charge carriers within the channel area 17 to be improved, by making provision for p-type electrical doping, regions extending the source and drain electrodes 11, 12 are formed by the first and third parts 201, 401, 203, 403 of the second and fourth nanowires 200, 400. In this sense, it results in a junction suitable for conducting holes between the regions extending the electrodes 11, 12 and the channel area 17 being formed. As a result, the pMOS transistor is even more effective.

According to one variant of the second particular embodiment and the improvement thereto which sees the first and third parts 201, 401, 203, 403 of the second and fourth nanowires 200, 400 electrically doped, the compressive stress in the channel area 17 does not necessarily need to be strictly higher than the compressive stress in the second parts 202, 402 of the second and fourth nanowires 200, 400 before their removal since the aforementioned first particular embodiment may even so be improved with doping that improves the operation of the transistor.

As was mentioned for each of the particular embodiments, a gate insulator (i.e. an electrically insulating material) may be interposed between the gate electrode and the channel area. In other words, generally, before the gate electrode is formed, the method may comprise a step of forming a gate insulator so that the latter covers the channel area between the first and second spacers, to prevent the gate electrode from making contact with the channel area. The gate insulator may be formed by depositing a suitable material and the gate electrode may then be formed by depositing another suitable material on the gate insulator. Preferably, the gate insulator forms an electrically insulating sleeve that surrounds, depending on the circumstances:

the assembly formed by the superposition of the second parts of the second, third and fourth nanowires, the sleeve forming channel area around the second part of the third nanowire.

The present method, although advantageous in the context of the fabrication of p-type (pMOS) transistors, may also be adapted to form n-type (nMOS) transistors, which will possibly be co-integrated into one and the same substrate using common technological steps. To do this, it is possible to form a stack or a plurality of stacks such as described above and to simultaneously implement a maximum of common steps. Next, it will be possible to differentiate the nMOS transistors from the pMOS transistors by alternately masking the structures intended to form pMOS transistors and the structures intended to form nMOS transistors, to process them independently. The processing of pMOS structures was described above. For example, to form an nMOS transistor, once the pMOS structures have been masked and protected, it is possible to remove the second parts of the second and fourth nanowires with a view to freeing the second part of the third nanowire, which will play the role of the channel area of the nMOS transistor once covered with a gate insulator that will, in turn, be covered by the gate electrode. Alternatively, after the second part of the third nanowire has been freed, it is possible to grow silicon on the second part of the third nanowire, which second part is itself also made of silicon.

It was described above that the channel area 17 may be formed by the preserved second part 202 of the second nanowire 200 (FIGS. 11, 13 and 14) or by forming the sleeve 21 (FIGS. 15 to 19). The thickness of the channel area 17, i.e. the thickness of the second part 202 of the second nanowire 200, or the thickness of the sleeve 21, has an influence on the operation of the transistor 1000. Specifically, the physical quantities of the transistor 1000 that are measurable during its operation may be degraded when the thickness of the conduction channel (i.e. of the channel area 17) is small, typically when this thickness is smaller than 3 nm. The thickness of the sleeve 21 may be defined as the thickness of the material deposited on the second part 302 of the third nanowire 300 in the step of epitaxial growth of this material. There is therefore a need to improve the physical quantities of the transistor 1000 that are measurable during its operation. To meet this need, it is preferable for the channel area 17 to have a thickness that is large enough to allow the carriers to behave in a way suited to the desired operation of the transistor 1000. However, where appropriate, the thickness of the second nanowire 200 obtained at the end of the step of forming the stack 2, or the thickness of the sleeve 21 obtained at the end of the step of epitaxial growth of the material used to form this sleeve 21, is not sufficient because this thickness has been limited with the aim of obtaining, where appropriate, a compact total thickness for the superposition of the second parts 202, 302, 402 of the second to fourth nanowires 200, 300, 400, or a compact outside dimension for the sleeve 21 along the Z-axis.

Thus, to meet this need to improve the physical quantities of the transistor 1000 that are measurable during its operation while allowing a compact total thickness to be obtained for the superposition of the second parts 202, 302, 402 of the second to fourth nanowires 200, 300, 400, the fabricating method may comprise, in the context of the first particular embodiment, a thermal annealing step making it possible for:
  the thickness of the second part 202 of the second nanowire 200 to be increased so that this thickness of the second part 202 of the second nanowire 200 reaches at least 3 nm,
  the thickness of the second part 302 of the third nanowire 300 to be decreased,
  the thickness of the second part 402 of the fourth nanowire 400 to be increased so that this thickness of the second part 402 of the fourth nanowire 400 reaches at least 3 nm, and
  that the thickness of the superposition of the second parts 202, 302, 402 of the second to fourth nanowires 200, 300, 400 at the end of the thermal annealing step to be identical to the thickness of, or of about the thickness of, this superposition before the thermal annealing step.

In this case, the second parts 202, 402 of the second and fourth nanowires 200, 400 are formed from silicon-germanium, and the third nanowire 300 is notably a silicon nanowire. Thus, when the second parts 202, 402 of the second and fourth nanowires 200, 400 are used to form the first and second channel area 17, 18, respectively, and when the thickness of each of these second parts 202, 402 of the second and fourth nanowires 200, 400 is smaller than 3 nm, but for example larger than or equal to 1 nm, it is possible to increase the thickness of each of the second parts 202, 402 of the second and fourth nanowires 200, 400 thanks to the thermal annealing step. For example, the thermal annealing step is carried out at a temperature comprised between 800° C. and 1100° C. for a preset length of time. When the temperature of the thermal annealing step is about 1100° C., the preset length of time may be about one second or about a few seconds. When the temperature of the thermal annealing step is about 800° C., the preset length of time may be about a few minutes or about a few tens of minutes. Such a thermal annealing step has the effect of diffusing the germanium of the second parts 202, 402 of the second and fourth nanowires 200, 400 into the second part 302 of the third nanowire 300 to modify the thickness of each of the second parts 202, 302, 402 of the second to fourth nanowires 200, 300, 400 in the way described above. The thermal annealing step may here be carried out after the sacrificial gate 9 and the second parts 102, 502 of the first and fifth nanowires 100, 500 have been removed. In other words, the thermal annealing step may be applied to the structure as shown in FIG. 13, in which the second parts 202, 402 of the second and fourth nanowires 200, 400 are exposed to this thermal anneal. The thermal annealing step may also be carried out after the gate electrode 19 or at least one part of this gate electrode 19 has been formed.

Moreover, to meet this need to improve the physical quantities of the transistor 1000 that are measurable during its operation while allowing a compact outside dimension to be obtained for the sleeve 21 along the Z-axis, a thermal annealing step may be carried out in the context of the second particular embodiment to increase the thickness of the sleeve 21 while decreasing the thickness and width of the second part 302 of the third nanowire 300, without significantly modifying the outside dimensions of the sleeve 21. Here, the sleeve 21 is preferably formed from silicon-germanium, and the third nanowire 300 is notably a silicon nanowire. Preferably, in the case where the thickness of the sleeve 21 is smaller than 3 nm, but for example larger than or equal to 1 nm, the fabricating method may comprise the thermal annealing step, which is for example carried out under the same conditions of temperature and of preset length of time as described above, ensuring a diffusion of the germanium present in the sleeve 21 into the second part 302 of the third nanowire 300, which results in a decrease in the thickness and in the width of the second part 302 of the third nanowire 300, and in an increase in the thickness of the sleeve 21 so that this thickness of the sleeve 21 reaches at least 3 nm. The thermal annealing step may here be carried out after the step of epitaxial growth of the material from the second part 302 of the third nanowire 300, or after the gate electrode 19 or at least one part of this gate electrode 19 has been formed. In other words, the thermal annealing step may be applied to the structure of FIG. 16 in which the sleeve 21 is exposed to this thermal anneal.

The invention also relates to an electronic device comprising a field-effect transistor 1000 (FIGS. 11 and 18), notably a pMOS transistor, having first and second spacers 10a, 10b between which the gate electrode 19 of the transistor 1000 is arranged, this gate electrode 19 notably making contact with the first and second spacers 10a, 10b. The device notably comprises the substrate 1, on which the transistor 1000 is formed. The first and second spacers 10a, 10b are located between the source electrode 11 of the transistor 1000 (which notably makes contact with the first spacer 10a) and the drain electrode 12 of the transistor 1000 (which notably makes contact with the second spacer 10b). The transistor 1000 comprises at least one semiconductor nano-object 304, notably formed from the third nanowire of the method described above, connecting the source electrode 11 to the drain electrode 12. The nano-object 304 may be a nanowire of suitable dimensions, or a nanoplate opposite ends of which, preferably longitudinal opposite ends, make contact with the source electrode 11 and the drain electrode 12, respectively. Notably, a first part 301 of the nano-object 304 is located under the first spacer 10a, and a second part 302 of the nano-object 304 connects the first part 301 of the nano-object 304 to a third part 303 of the nano-object 304, which third part is located under the second spacer 10b. The second part 302 of the nano-object 304 notably extends into the region located between the first and second spacers 10a, 10b. The second part 302 of the nano-object 304 is notably located under the gate electrode 19. The first part 301 of the nano-object 304 is interposed between, and makes contact with, first and second semiconductor elements 1001a, 1001b of the transistor 1000, the first and second semiconductor elements 1001a, 1001b preferably being compressively stressed. The first and second semiconductor elements 1001a, 1001b correspond to the first parts 201, 401 of the second and fourth nanowires 200, 400 described in the context of the method, respectively. Thus, the first semiconductor element 1001a is closer to the substrate 1 than the second semiconductor element 1001b is. The third part 303 of the nano-object 304 is interposed between, and makes contact with, third and fourth semiconductor elements 1001c, 1001d of the transistor 1000, the third and fourth semiconductor elements 1001c, 1001d preferably being compressively stressed. The third and fourth semiconductor members 1001c, 1001d correspond to the third parts 203, 403 of the second and fourth nanowires 200, 400 described in the context of the method, respectively. Thus, the third semiconductor element 1001c is closer to the substrate 1 than the fourth semiconductor element 1001d is. The first semiconductor element 1001a connects the source electrode 11 to a compressively stressed channel area 17 of the transistor 1000, and the third semiconductor element 1001c connects the drain electrode 12 to the channel area 17 of the transistor 1000. Said channel area 17 is distinct from the nano-object 304, and is notably formed on the second part 302 of the nano-object 304. The gate electrode 19 surrounds the channel area 17 of the transistor.

In correlation with the first particular embodiment described above and shown in FIG. 11, the transistor 1000 may comprise first and second semiconductor bars 204, 404, each for example taking the form of a nanowire (respectively corresponding to the first, second and third parts 201, 202, 203, 401, 402, 403 of the second and fourth nanowires 200, 400 of the method described above). The nano-object 304 is arranged between, and notably makes contact with, these first and second semiconductor bars 204, 404. The first semiconductor bar 204 comprises, in succession, a first part 201 forming the first semiconductor element 1001a, a second part 202 forming the channel area 17 (the first channel area described above) and a third part 203 forming the third semiconductor element 1001c. Moreover, the second semiconductor bar 404 comprises, in succession, first, second and third parts 401, 402, 403, the second part 402 of the second semiconductor bar 404 forming a compressively stressed additional channel area 18 (the second channel area described above) of the transistor 1000, the first part 401 of the second semiconductor bar 404 forming the second semiconductor element 1001b connecting the additional channel area 18 to the source electrode 11, and the third part 403 of the second semiconductor bar 404 forming the fourth semiconductor element 1001d connecting the additional channel area 18 to the drain electrode 12. It will be understood that the materials and dimensions of the nanowires and bars may be such as those described in the context of the method; notably, the nano-object 304 is made of silicon and the first and second semiconductor bars 204, 404 are made of silicon-germanium. The first and second semiconductor bars 204, 404 each here form a continuous piece of material: they are integrally formed. Here the compressive stress within the first and second semiconductor bars 204, 404 is an axial stress along an axis passing through the source electrode 11 and drain electrode 12.

In correlation with the second particular embodiment (FIG. 18) described above, the second part 302 of the nano-object 304 is covered, notably entirely or partially, with a material or a sleeve 21 forming the compressively stressed channel area 17 of the transistor 1000. Notably, this sleeve 21, or this material forming the channel area 17, extends along said second part 302 of the nano-object 304. In particular, the sleeve 21, or the material, forming the channel area is arranged in a region located between the first and second spacers 10a, 10b. The first and second semiconductor elements 1001a, 1001b connect this sleeve 21 to the source electrode 11, and the third and fourth semiconductor elements 1001c, 1001d connect this sleeve 21 to the drain electrode 12. The first to fourth semiconductor elements may be electrically doped with boron. Here, the nano-object 304 may be a silicon nano-object and the first to fourth semiconductor elements 1001a, 1001b, 1001c, 1001d may be made of SiGe, doped or not with boron.

It will be understood that everything that was described above in the context of the method may be applied to the device described above, which may notably be obtained using the method such as described. The advantages associated with the method may be applied to the device. Notably, a gate insulator 20 is interposed between the one or more channel areas 17, 18 and the gate electrode 19. Preferably, the nano-object 304 is a silicon nano-object, the first and second bars are silicon-germanium bars, the first to fourth semiconductor elements are made of silicon-germanium for example electrically doped when the channel area is a sleeve 21 made of silicon-germanium.

The method may allow a plurality of transistors to be fabricated from the same stack 2. For each transistor, a structure comprising a sacrificial gate and first and second spacers will be formed before the corresponding steps of the fabricating method described above are applied to each structure.

Notably, the transistors obtained in the present description are GAA transistors.

According to one embodiment, the second and fourth nanowires 200, 400 of the stack 2 may not be compressively stressed. In this case, they are electrically doped, notably p-doped, with the aim of forming regions extending the source and drain electrodes under the first and second spacers 10a, 10b. This embodiment is notably combined with the second particular embodiment in the sense that the channel area is formed by epitaxially depositing material on the second part 302 of the third nanowire 300. In this case, before this epitaxial deposition, the second parts 202, 402 of the second and fourth nanowires 200, 400 are removed. Here, the method allows the first and third parts 201, 401, 203, 403 of the second and fourth nanowires 200, 400 to be preserved, these parts being p-doped to promote the conduction of holes between the source and drain electrodes and the channel area 17. Moreover, the epitaxial deposition of the material allows the compressively stressed channel area to be formed. According to this embodiment, the second and fourth nanowires 200, 400 may be made of p-doped SiGe, the p-doping for example being achieved with boron.

The invention claimed is:

1. Method for fabricating a field-effect transistor, comprising:
   a step of forming, on a substrate, a stack comprising successive first to fifth semiconductor nanowires,
   a step of producing a sacrificial gate and first and second spacers arranged on either side of the sacrificial gate, the sacrificial gate and the first and second spacers covering a part of the stack comprising first, second and third parts of each of the first to fifth nanowires,
   a step of removing the sacrificial gate,
   a step of removing the second parts of the first and fifth nanowires which second parts are made accessible by the step of removing the sacrificial gate, this step of removing the second parts of the first and fifth nanowires resulting in the suspension of an assembly formed by the second parts of the second to fourth nanowires between the first and second spacers,
   a step of forming a channel area of the transistor, which channel area is compressively stressed and distinct from the second part of the third nanowire said channel area being connected:
      to a source electrode of the transistor by the first part of the second nanowire, and
      to a drain electrode of the transistor by the third part of the second nanowire, and
   a step of producing a gate electrode of the transistor between the first and second spacers and around the channel area.

2. Method according to claim 1, wherein:
   the step of forming the stack is such that the second and fourth nanowires are compressively stressed,
   said channel area of the transistor is a first channel area formed by the second part of the second nanowire connecting the first and third parts of the second nanowire,
   a compressively stressed second channel area of the transistor is formed by the second part of the fourth nanowire connecting the first and third parts of the fourth nanowire, the first part of the fourth nanowire connecting the source electrode to the second part of the fourth nanowire, and the third part of the fourth nanowire connecting the drain electrode to the second part of the fourth nanowire,
   the second part of the third nanowire is arranged between the second parts of the second and fourth nanowires, and
   the step of producing the gate electrode is such that said gate electrode surrounds an assembly formed by a superposition of the second parts of the second to fourth nanowires.

3. Method according to claim 1, comprising:
   a step of removing the second parts of the second and fourth nanowires, which results in releasing the second part of the third nanowire between the first and second spacers, and
   a step of growing a material epitaxially, from the second part of the third nanowire, to form the channel area having a compressive stress induced by the second part of the third nanowire,
   wherein at the end of the step of growing the material epitaxially, the first part of the fourth nanowire connects the channel area to the source electrode, and the third part of the fourth nanowire connects the channel area to the drain electrode.

4. Method according to claim 3, wherein the epitaxial growth step is such that the channel area has a thickness, in a direction normal to the surface of the second part of the third nanowire equal to the thickness of the second and fourth nanowires measured in the stacking direction of the first to fifth nanowires.

5. Method according to claim 3, characterized in that the second and fourth nanowires of the stack are electrically doped, preferably with boron.

6. Method according to claim 1, characterized in that the step of forming the stack is such that the third nanowire is a silicon nanowire and the first, second, fourth and fifth nanowires are silicon-germanium nanowires, the proportion of germanium in the silicon-germanium of the first and fifth nanowires being higher than the proportion of germanium in the silicon-germanium of the second and fourth nanowires.

7. Method according to claim 6, wherein the proportion of germanium in the silicon-germanium of the first and fifth nanowires is between 25 at % and 50 at %, and in that the proportion of germanium in the silicon-germanium of the second and fourth nanowires is between 10 at % and 40 at %.

8. Method according to claim 1, comprising, after the step of producing the sacrificial gate and the first and second spacers:
   a step of removing portions of the stack in such a way that that part of the stack that is covered by the sacrificial gate and by the first and second spacers is preserved, then
   a step of producing source and drain electrodes on either side of a structure comprising the sacrificial gate and the first and second spacers so that:
      the source electrode makes contact with the first parts of the second, third and fourth nanowires, and
      the drain electrode makes contact with the third parts of the second, third and fourth nanowires.

9. Method according to claim 8, comprising, between the step of removing portions of the stack and the step of producing source and drain electrodes:
   a step of removing all or some of the first and third parts of the first and fifth nanowires, which parts are located under the first and second spacers, so as to form cavities, and
   a step of filling the cavities with an electrical insulator to form internal spacers that are intended to electrically insulate and separate the gate electrode of the transistor from the source and drain electrodes of the transistor.

10. Method according to claim 1, wherein:
   the third nanowire has a thickness, measured in a stacking direction of the first to fifth nanowires, between 2 nm and 15 nm;
   the second and fourth nanowires each have a thickness, measured in the stacking direction of the first to fifth nanowires, between 1 nm and 5 nm, and
   the first and fifth nanowires each have a thickness, measured in the stacking direction of the first to fifth nanowires, between 5 nm and 25 nm.

11. Electronic device comprising a field-effect transistor having first and second spacers between which is arranged a gate electrode of the transistor, the first and second spacers being located between a source electrode of the transistor and a drain electrode of the transistor, said transistor comprising at least one semiconductor nano-object connecting the source electrode to the drain electrode, a first part of the nano-object being located under the first spacer, and a second part of the nano-object connecting the first part of the nano-object to a third part of the nano-object which third part is located under the second spacer, wherein:

the first part of the nano-object is interposed between, and makes contact with, first and second semiconductor elements of the transistor, said first and second semiconductor elements preferably being compressively stressed, the third part of the nano-object is interposed between, and makes contact with, third and fourth semiconductor elements of the transistor, said third and fourth semiconductor elements preferably being compressively stressed, the first semiconductor element connects the source electrode to a compressively stressed channel area of the transistor, and the third semiconductor element connects the drain electrode to the channel area of the transistor, said channel area being distinct from the nano-object, and the gate electrode surrounds the channel area of the transistor.

12. Device according to claim 11, wherein the transistor comprises first and second semiconductor bars, the nano-object being arranged between the first and second bars, the first bar comprising, in succession, a first part forming the first semiconductor element, a second part forming the channel area, and a third part forming the third semiconductor element, and the second bar comprises, in succession, first, second and third parts, the second part of the second bar forming a compressively stressed additional channel area of the transistor, the first part of the second bar forming the second element connecting the additional channel area to the source electrode, and the third part of the second bar forming the fourth element connecting the additional channel area to the drain electrode.

13. Device according to claim 11, wherein the second part of the nano-object is covered with a sleeve forming the compressively stressed channel area of the transistor, the first and second semiconductor elements connecting this sleeve to the source electrode, and the third and fourth semiconductor elements connecting this sleeve to the drain electrode.

\* \* \* \* \*